(12) United States Patent
Ma et al.

(10) Patent No.: US 12,332,526 B2
(45) Date of Patent: Jun. 17, 2025

(54) DISPLAY SUBSTRATE, DISPLAY PANEL AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Xiaoye Ma, Beijing (CN); Yongxian Xie, Beijing (CN); Hui Guo, Beijing (CN); Jiale Li, Beijing (CN); Zhiwei Ding, Beijing (CN); Xiaowei Xu, Beijing (CN); Huanhuan Huang, Beijing (CN); Ling Liu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/764,131

(22) Filed: Jul. 3, 2024

(65) Prior Publication Data

US 2024/0361657 A1  Oct. 31, 2024

Related U.S. Application Data

(63) Continuation of application No. PCT/CN2023/084483, filed on Mar. 28, 2023.

(51) Int. Cl.
*G02F 1/1362* (2006.01)
*G02F 1/1368* (2006.01)
(Continued)

(52) U.S. Cl.
CPC ........ *G02F 1/13629* (2021.01); *G02F 1/1368* (2013.01); *G06F 3/0412* (2013.01);
(Continued)

(58) Field of Classification Search
None
See application file for complete search history.

(56) References Cited

U.S. PATENT DOCUMENTS 11,410,627 B2    8/2022  Xiao et al.
11,803,089 B2 *  10/2023 Yamazaki ......... G02F 1/136286
(Continued)

FOREIGN PATENT DOCUMENTS

CN    110515496 A    11/2019
CN    115101024 A     9/2022
(Continued)

*Primary Examiner* — Duane N Taylor, Jr.
(74) *Attorney, Agent, or Firm* — IPro, PLLC

(57) ABSTRACT

Disclosed are a display substrate, a display panel and a display device. The display substrate includes: a base substrate, multiple gate-line groups, multiple data lines, the multiple data line include: first type of data lines and second type of data lines alternately arranged along the first direction; multiple transistors, transistors in the same sub-transistor group are connected with the same gate line, transistors in adjacent sub-transistor groups are connected with different gate lines, and transistors of the same sub-transistor group are connected with different data lines; multiple pins, the multiple pins include: first type of pins and second type of pins alternately arranged along the first direction; two adjacent first type of data lines are connected with a same first type of pin, and adjacent second type of data lines are connected with a same second type of pin.

20 Claims, 24 Drawing Sheets

(51) Int. Cl.
  *G06F 3/041* (2006.01)
  *G06F 3/044* (2006.01)
  *G09G 3/36* (2006.01)

(52) U.S. Cl.
  CPC ........ *G06F 3/04164* (2019.05); *G06F 3/0443* (2019.05); *G09G 3/3614* (2013.01); *G02F 2201/123* (2013.01); *G06F 2203/04103* (2013.01); *G09G 2300/0426* (2013.01); *G09G 2320/0247* (2013.01); *G09G 2320/0257* (2013.01); *G09G 2330/023* (2013.01); *G09G 2354/00* (2013.01)

(56) References Cited

U.S. PATENT DOCUMENTS

| | | |
|---|---|---|
| 2011/0187685 A1 | 8/2011 | Kwon |
| 2019/0051670 A1 | 2/2019 | Bei et al. |
| 2021/0005631 A1 | 1/2021 | Wang et al. |

FOREIGN PATENT DOCUMENTS

| | | |
|---|---|---|
| KR | 20200050871 A | 5/2020 |
| WO | 2022205164 A1 | 10/2022 |

* cited by examiner

| Brightness difference at non-averageable position within one frame | | Human eyes fixed | | Head shaking | |
|---|---|---|---|---|---|
| Observer acceptable image | N Frame | Bright | Dark | Bright | Dark |
| | N+1 Frame | Dark | Bright | Missing | |
| | N+2 Frame | Bright | Dark | Bright | Dark |
| | N+3 Frame | Dark | Bright | Dark | Bright |
| Superpose to form an image | | Brightness neutralizing available | | Neutralizing temporally disable | |

---------------- 94

DISPLAY SUBSTRATE, DISPLAY PANEL AND DISPLAY DEVICE

CROSS-REFERENCE TO RELATED APPLICATIONS

The application is a continuation application of International Application No. PCT/CN2023/084483, filed Mar. 28, 2023, which is hereby incorporated by reference in its entirety.

TECHNICAL FIELD

The present disclosure relates to the field of semiconductor technology, and in particular to a display substrate, a display panel and a display device.

BACKGROUND

As shown in FIG. 1A, it is a single-gate structure, each row of pixels corresponds to one gate line, and each column of data lines corresponds to one column of pixels. Compared to the single-gate structure, the dual-gate product shown in FIG. 1B reduces the number of source integrated circuits (ICs) by increasing the number of gate lines and decreasing the number of data lines, thereby reducing costs. For example, a product with a resolution of 1280*480 has 480 lines of gate lines, 1280*3=3840 of data lines, and 1920 channels of popular ICs, and a total of 2 source ICs are required to drive the entire panel. If the dual gate technology is used, the number of gate lines is 480*2=960 rows, because gate usually uses gate on array (GOA) technology, the increase of gate lines will not lead to an increase in the number of gate ICs, and the number of data lines is 1280*3/2=1920, then only one IC is used.

SUMMARY

Embodiments of the present disclosure provide a display substrate including:
a base substrate;
a plurality of gate-line groups on a side of the base substrate and extending along a first direction, where at least one of the plurality of gate-line groups includes two gate lines extending along the first direction;
a plurality of data lines on the side of the base substrate with the gate lines and extending in a second direction; the plurality of data lines include first type of data lines and second type of data lines alternately arranged along the first direction;
a plurality of transistors in an area formed by an intersection of the gate-line groups and the data lines, the plurality of transistors include: sub-transistor groups arranged between adjacent gate-line groups and arranged along the first direction, each of the sub-transistor groups includes two transistors, the transistors in the same sub-transistor group are connected with the same gate line, the transistors of adjacent sub-transistor groups are connected with different gate lines, and the transistors of the same sub-transistor group are connected with different data lines;
a plurality of pins on the side of the base substrate with the gate lines, the plurality of pins include: first type of pins and second type of pins alternately arranged along the first direction; where two adjacent first type of data lines are connected with the same first type of pin, and adjacent second type of data lines are connected with the same second type of pin.

In some embodiments, each of the gate-line group includes a first gate line and a second gate line;
the plurality of transistors include: a first transistor row and a second transistor row extending along the first direction and alternately arranged along the second direction; each of the sub-transistor groups includes a first sub-transistor group and a second sub-transistor group alternately arranged along the first direction;
in the first transistor row, a transistor in the first sub-transistor group is connected with the first gate line, and a transistor in the second sub-transistor group is connected with the second gate line; in the second transistor row, a transistor in the first sub-transistor group is connected with the second gate line, and a transistor in the second sub-transistor group is connected with the first gate line; and two adjacent transistors in a same column are connected with different data lines.

In some embodiments, the display substrate further includes: a plurality of first leads and a plurality of second leads;
each of the first leads includes: a first connecting portion and two first lead ends; one end of the first connecting portion is connected with the first type of pin, and the other end of the first connecting portion is connected with the two first lead ends; the other ends of the first lead ends are connected with the first type of data line;
each of the second leads includes: a second connecting portion and two second lead ends, one end of the second connecting portion is connected with the second type of pin, the other end of the second connecting portion is connected with the two second lead ends, and the other ends of the second lead ends are connected with the second type of data line.

In some embodiments, an orthographic projection of one of the two first lead ends on the base substrate intersects with an orthographic projection of one of the two second lead ends on the base substrate.

In some embodiments, the first leads and the second leads are arranged in different layers.

In some embodiments, the first leads are arranged on a same layer as the data lines; the second leads are arranged on a same layer as the gate lines.

In some embodiments, the display substrate further includes an adapter portion;
an end of the second type of data line further includes a first lap portion, an orthographic projection of the adapter portion on the base substrate covers an orthographic projection of the first lap portion on the base substrate, and the adapter portion is connected with the first lap portion through a first through hole;
each of the second lead ends further includes a second lap portion, the orthographic projection of the adapter portion on the base substrate covers an orthographic projection of the second lap portion on the base substrate, and the adapter portion is connected with the second lap portion through the second through hole;
the first lap portion and the second lap portion are electrically connected with each other through the adapter portion.

In some embodiments, the display substrate further includes a common electrode layer, and the adapter portion and the common electrode layer are on the same layer and of same material.

In some embodiments, the common electrode layer is multiplexed as a touch electrode layer; the touch electrode layer includes a plurality of touch electrode blocks spaced from each other;

the display substrate further includes a touch trace layer, and the touch trace layer includes touch traces that correspond to the touch electrode blocks in an one-to-one manner;

the touch traces and the data lines are arranged in different layers.

In some embodiments, an orthographic projection of the touch trace on the base substrate covers an orthographic projection of the data line on the base substrate.

In some embodiments, the display substrate further includes: a pixel electrode layer arranged on a side of a layer where the data lines are located facing away from the base substrate; the common electrode layer is arranged on a side of the pixel electrode layer facing away from the base substrate;

the touch trace layer is between the pixel electrode layer and the common electrode layer.

In some embodiments, the display substrate further includes a first passivation layer between the touch trace layer and the common electrode layer, the first passivation layer includes third through holes exposing the touch traces, and the touch traces are electrically connected with the touch electrode blocks through the third through holes.

In some embodiments, an orthographic projection of each of the third through holes on the base substrate is located at a gap between two gate lines in the same gate-line group.

Embodiments of the present disclosure provide a display panel, including the display substrate as described in above embodiments.

Embodiments of the present disclosure provide a display device, including the display panel as described in above embodiments.

Embodiments of the present disclosure provide a driving method for the display substrate as described in above embodiments, where the driving method includes:

in response to a picture in a Nth frame being displayed, loading a first type of signal to the first type of pins, and a second type of signal to the second type of pins, where a polarity of the first type signal is opposite to a polarity of the second type of signal, where N is an integer; in response to a picture in a (N+1)th frame being displayed, loading the second type of signal to the first type of pins, and loading the first type of signal to the second type of pins.

DETAILED DESCRIPTION

Figure 1A:
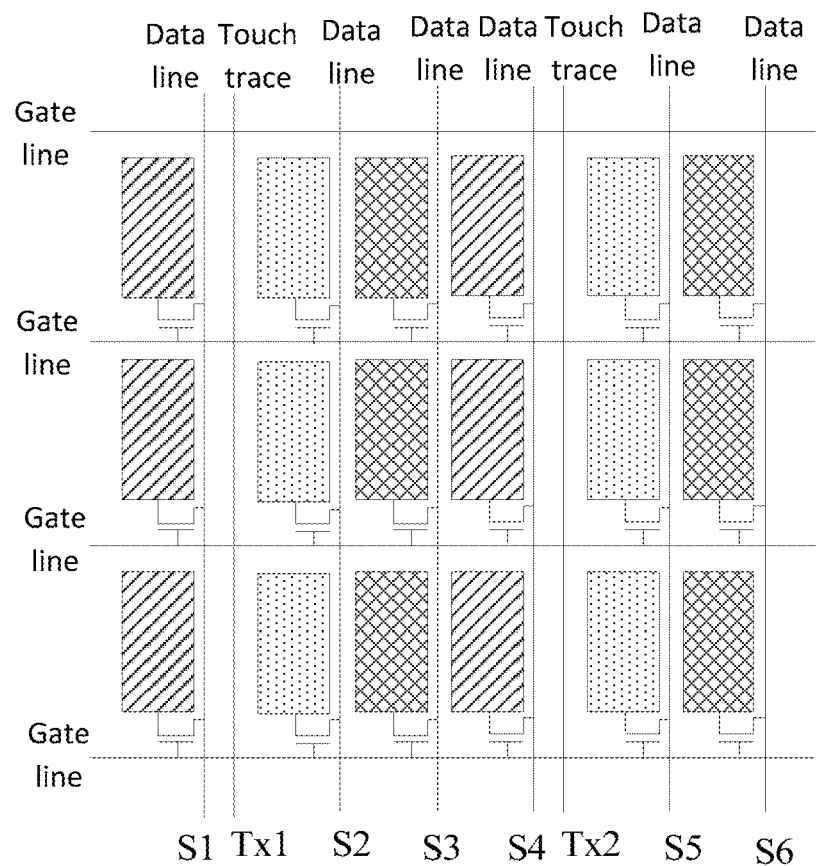
FIG. 1A is a schematic diagram of a display panel with a single-gate structure.
Figure 1B:
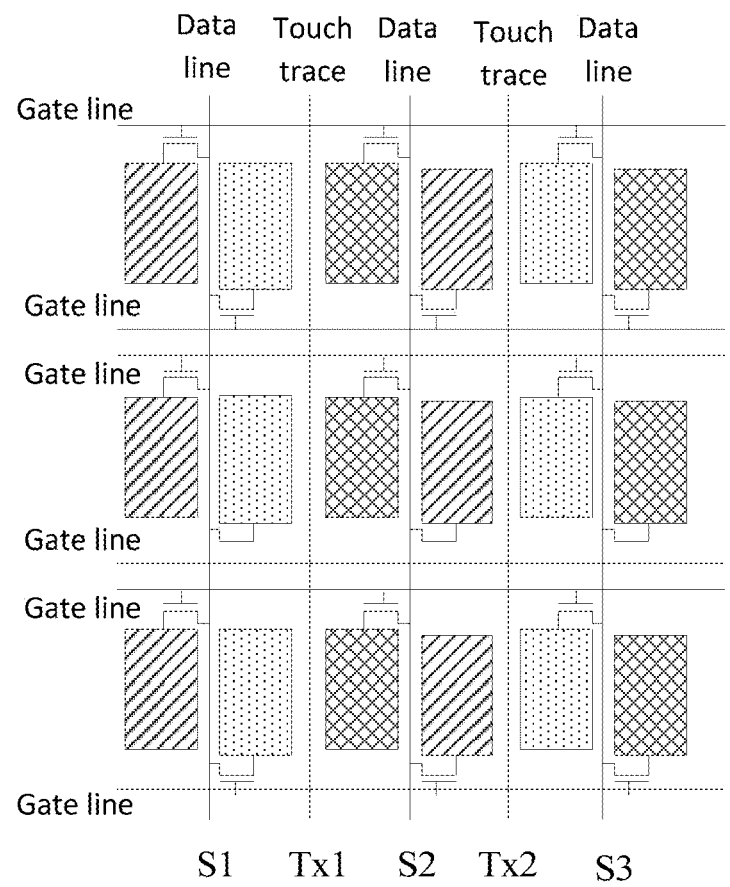
FIG. 1B is a schematic diagram of a display panel with a double-gate structure.

In order to make the purpose, technical scheme and advantages of embodiments of the present disclosure more clear, the technical scheme of embodiments of the present disclosure will be clearly and completely described below in conjunction with the drawings of embodiments of the present disclosure. It should be noted that the size and shape of each figure in the drawings do not reflect the true proportions, and the purpose is only to illustrate the contents of the present disclosure, and that the same or similar designation at all times indicates the same or similar element or component with the same or similar function.

Obviously, the described embodiments are some embodiments of the present disclosure, not all embodiments. Based on the described embodiments of the present disclosure, all other embodiments obtained by a person skilled in the art without creative labor are within the scope of protection of the present disclosure.

Unless otherwise defined, the technical or scientific terms used herein shall have the ordinary meaning understood by persons of general skill in the field to which the disclosure belongs. The words "first", "second" and similar words used in the description of the present disclosure and in the claims do not indicate any order, quantity or importance, but are only used to distinguish different components. Words such as "include" or "comprise" mean that the element or object preceding the word includes the element or object listed after the word and its equivalents, and does not exclude other elements or objects. "Inside", "Outside", "Up", "Down", etc., are only used to indicate a relative positional relationship, and when the absolute position of the described object changes, the relative positional relationship may also change accordingly.

As used herein, the words "approximately" or "substantially the same" include the stated values and imply an acceptable deviation from the specific values as determined by a person of ordinary skill in the art taking into account the measurements in question and the errors associated with the measurements of the specific quantities (i.e., the limitations of the measurement system). For example, "approximately the same" can mean that the difference from the stated value is within one or more standard deviations, or within the range of +30%, 20%, 10%, or 5%.

In the attached drawings, the thickness of layers, films, panels, areas, etc., is enlarged for clarity. In this article, an exemplary embodiment is described with reference to a cross-sectional diagram that is a schematic diagram of an idealized embodiment. In this way, deviations from the shape of the diagram are expected as a result of, for example, manufacturing techniques and/or tolerances. Therefore, embodiments described in this article should not be construed as being limited to the specific shape of the area shown herein, but rather as including deviations in the shape caused by, for example, manufacturing. For example, an area that is illustrated or described as flat can typically have rough and/or non-linear characteristics. In addition, the sharp corners shown can be round. Thus, the areas shown in the diagram are inherently schematic, and their shapes do not purport the exact shape of the illustrated areas and are not intended to limit the scope of the claims.

In order to keep the following descriptions of embodiments of the present disclosure clear and concise, the detailed descriptions of known functions and known parts are omitted.

Figure 2A:
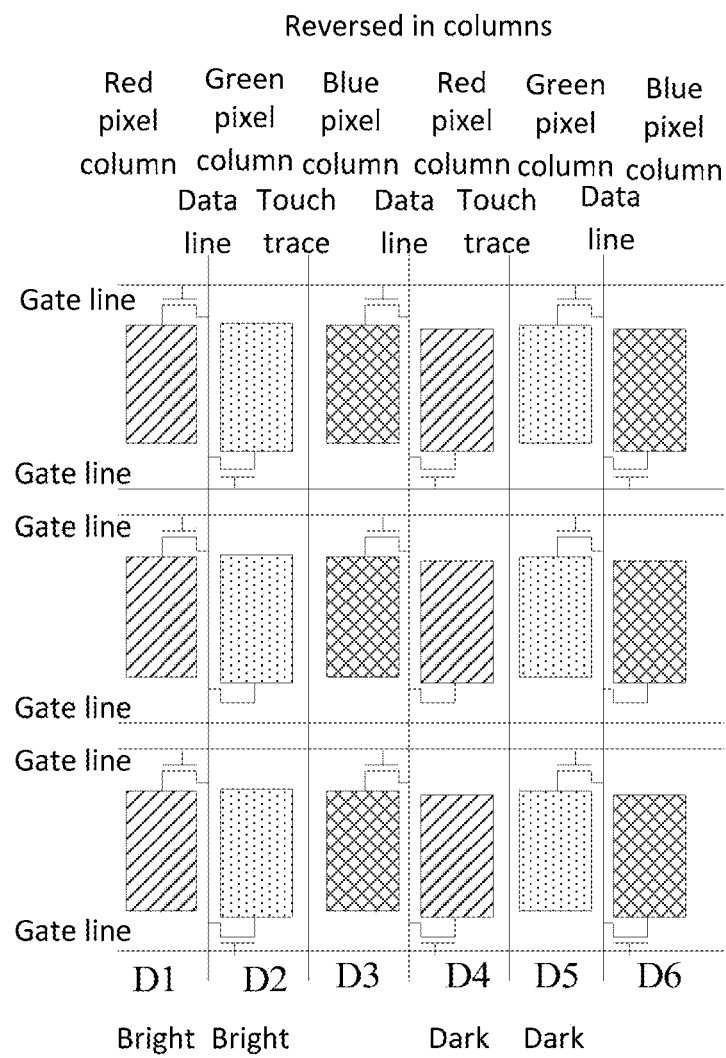
FIG. 2A is a schematic diagram of the display panel of column flipping of a double-gate structure.
Figure 2B:
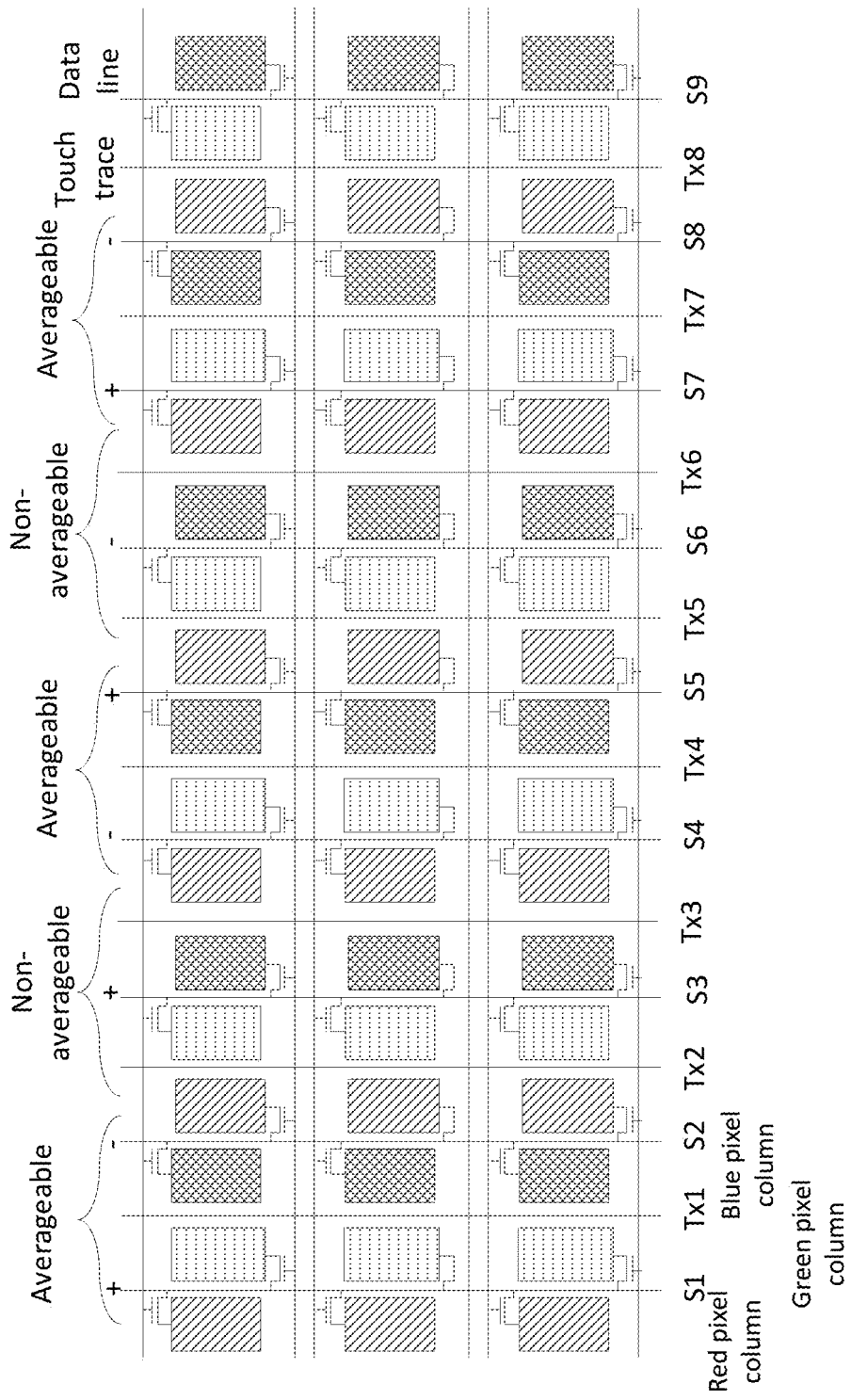
FIG. 2B is the first the schematic diagram of a double-gate structure producing shake-head stripes.
Figures 2C, 2D:
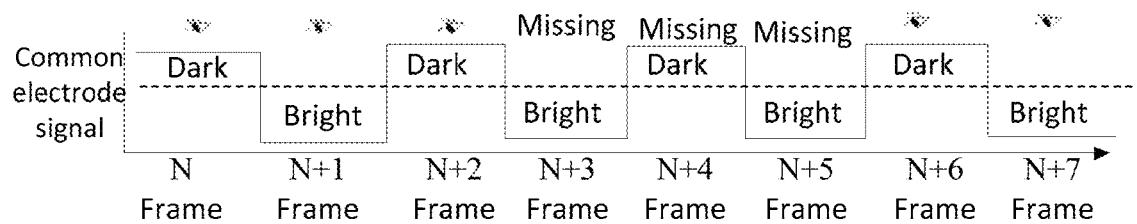
FIG. 2C is the second schematic diagram of a double-gate structure producing shake-head stripes.
FIG. 2D is the third schematic diagram of a double-gate structure producing shake-head stripes.
Figure 2E:
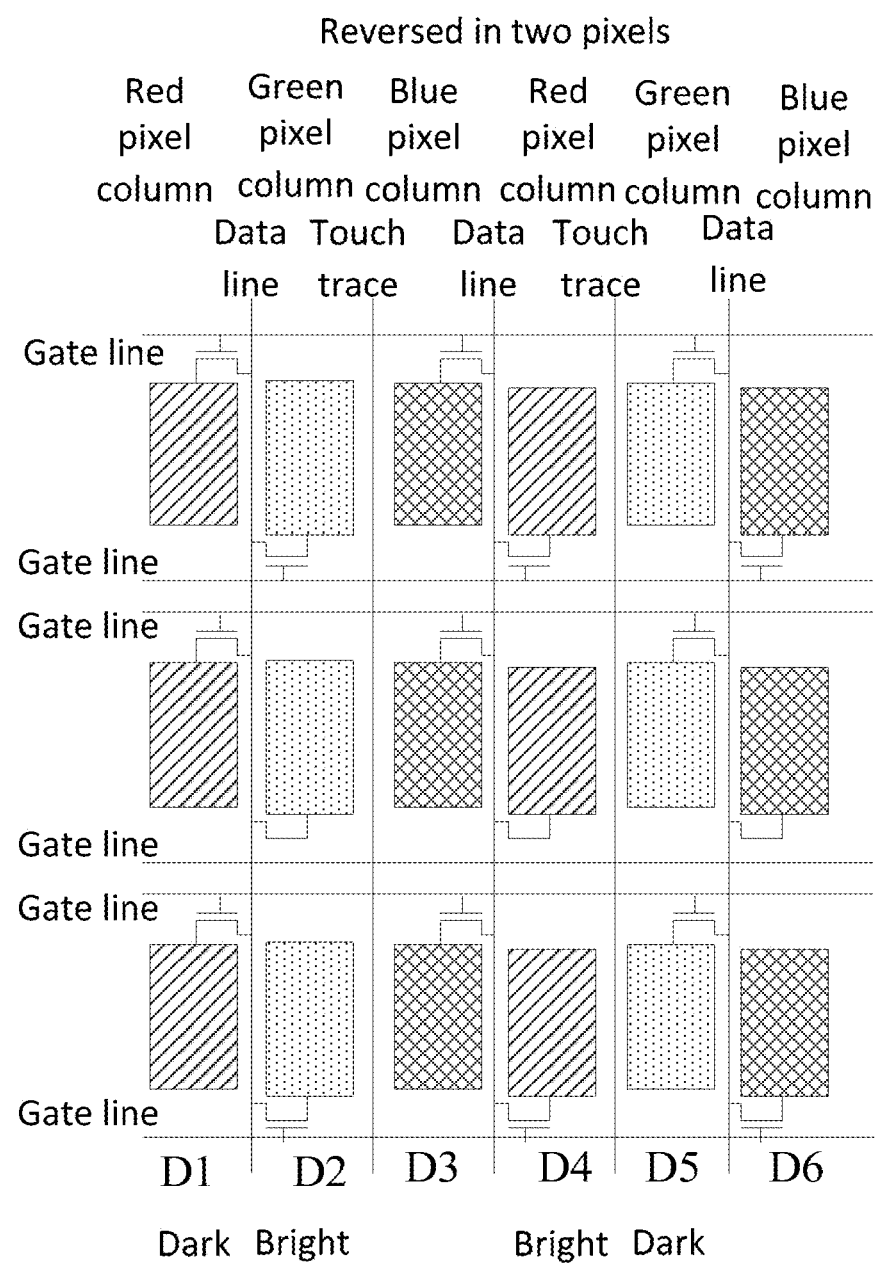
FIG. 2E is a schematic diagram of the display panel of a double-gate structure with point flipping.
Figure 3:
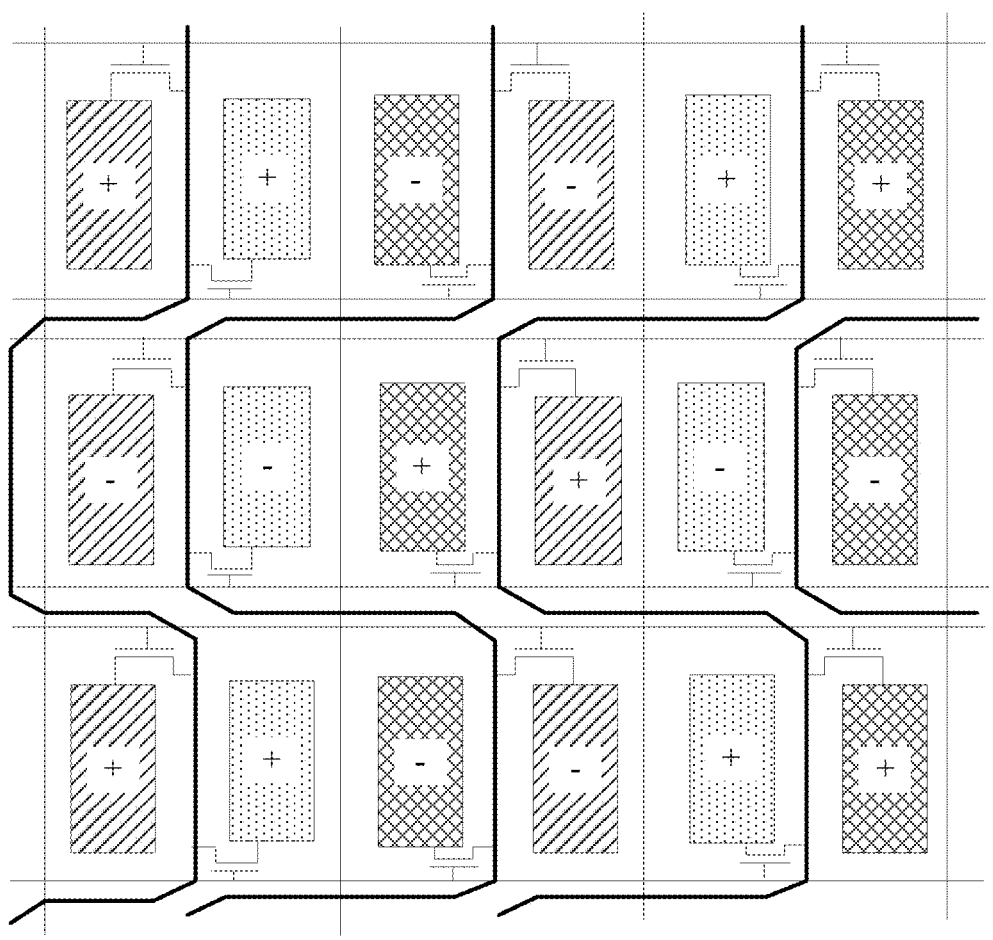
FIG. 3 is a schematic diagram of the display panel of a double-gate structure with a Z architecture.

In the related dual gate pixel architecture, when using column inversion, the color mixing pattern and special pattern (for example, pure green picture), etc., there are differences in charging in different columns, and there are poor vertical lines, as shown in FIG. 2A, the yellow pattern of red and green color mixing, the corresponding sub-pixels of red and green are bright, and the blue sub-pixels are not bright. The Column D1, Column D2, Column D4, and Column D5 in FIG. 2A are bright, and the Column D3 and Column D6 are not bright. When using column inversion, the corresponding data voltage of Column D1 and Column D2 is DC, Column D1 and Column D2 charge strongly. Because Column D3 is not bright, Column D4 is bright, and the data voltage connected with Column D3 and Column D4 is AC, resulting in the charging rate of Column D4 is lower than that of Column D1, and the charging rate of Column D5 is lower than that of Column D2. In some embodiments, as shown in FIG. 2B to FIG. 2D, for a monochrome picture, such as a red picture. Spatially: in the same frame, the polarity of each red pixel column is +−+− periodic cycle, and the adjacent polarities are +−, the brightness can be averaged, and the adjacent polarities are ++ or −−, and the brightness cannot be averaged, and the polarity needs to be inversed in the next frame or, averaged by the brightness of the two frames. Temporal: During continuous observation, the polarity of each frame is inversed, and the sum of brightness of each column between adjacent frames can be averaged. The frame may be lost when the head is moved, resulting in the loss of time averaging effect of the two columns that are not averaging in space, resulting in periodic vertical stripes, called shake-head stripes. In order to alleviate the poor vertical stripes. A 2-dot inversion is usually used, as shown in FIG. 2E. While the 2-dot inversion consumes a lot of power. In order to use column inversion, a Z architecture of dual gate is proposed, as shown in FIG. 3, where the data line needs to be wound to adjacent sub-pixels, reducing the opening ratio of pixels.

Therefore, there is an urgent need for people in the field to propose a dual-gate pixel structure that can not only use column inversion, but also avoid the difference in charging of different columns, and do not reduce the opening rate.

Figure 7A:
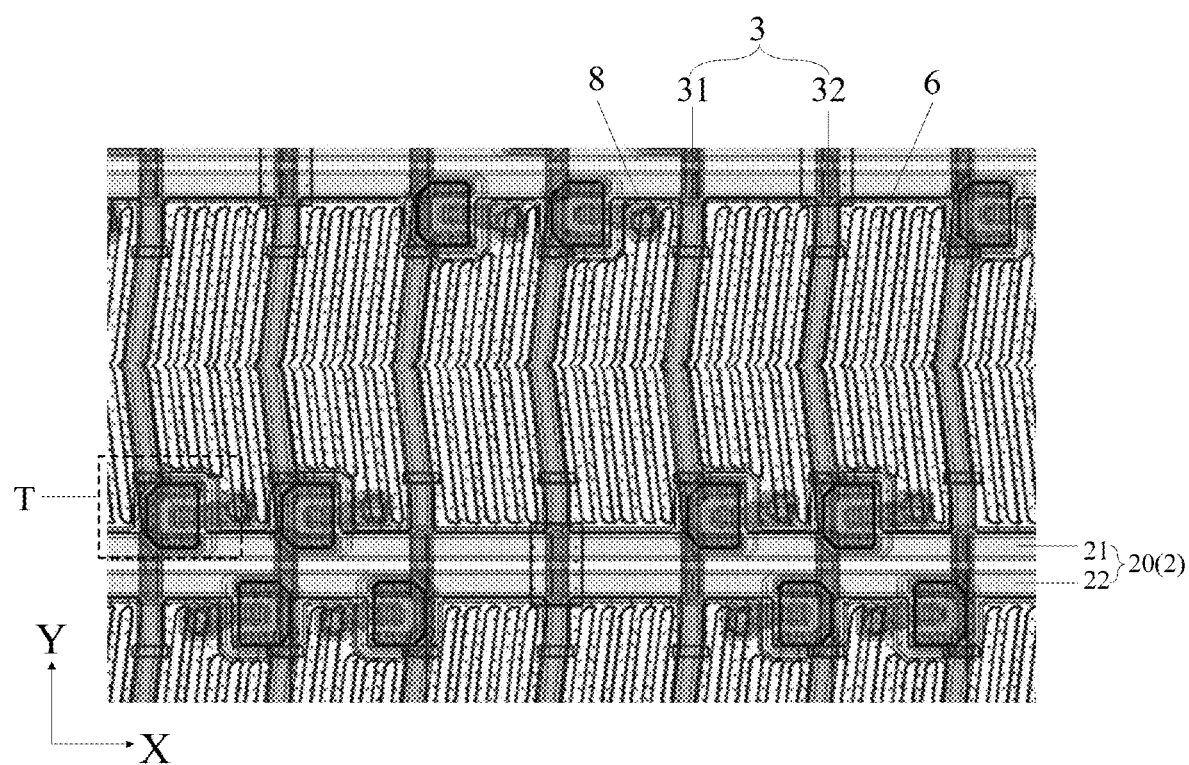
FIG. 7A is a schematic diagram of film layers of the display substrate provided by an embodiment of the present disclosure.
Figure 7B:
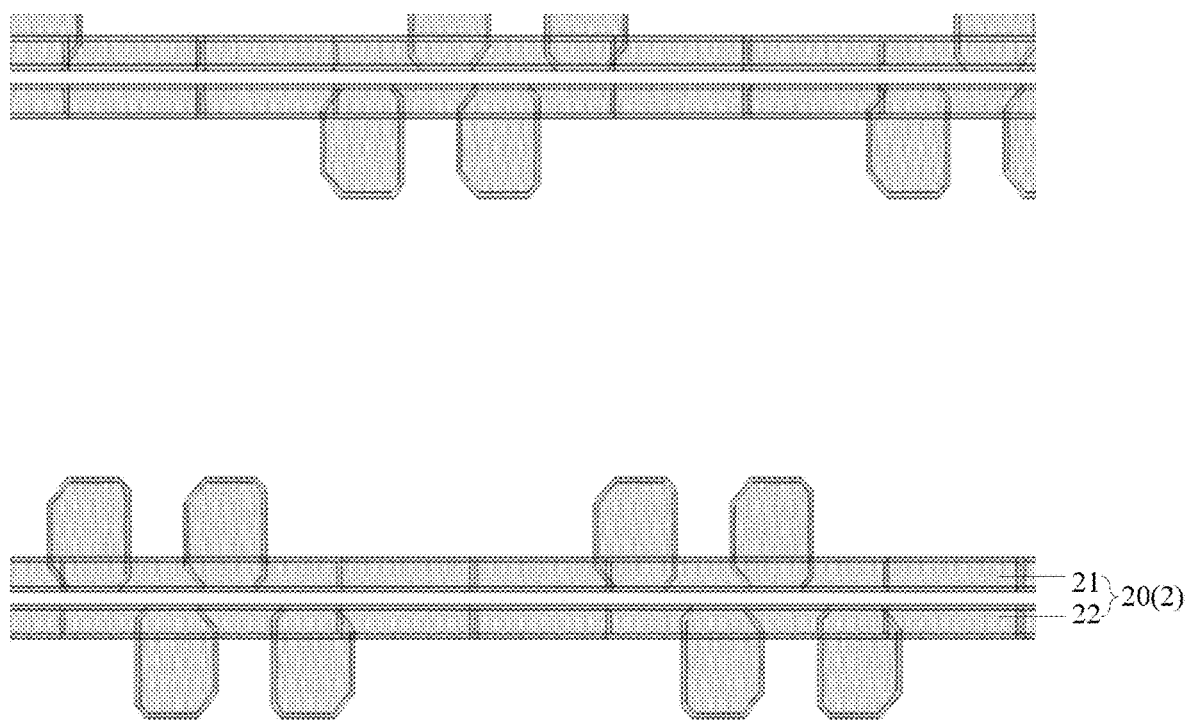
FIG. 7B is a schematic diagram of a single layer of a gate line in FIG. 7A.
Figure 7C:
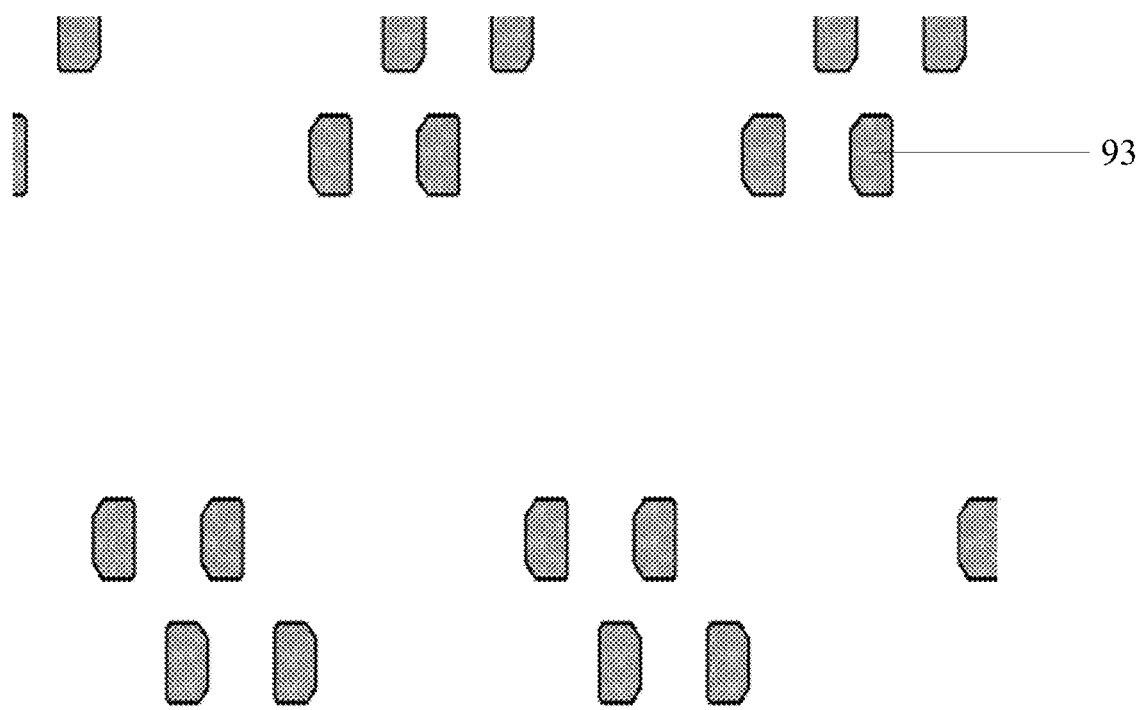
FIG. 7C is a schematic diagram of a single layer with an active layer in FIG. 7A.
Figure 7D:
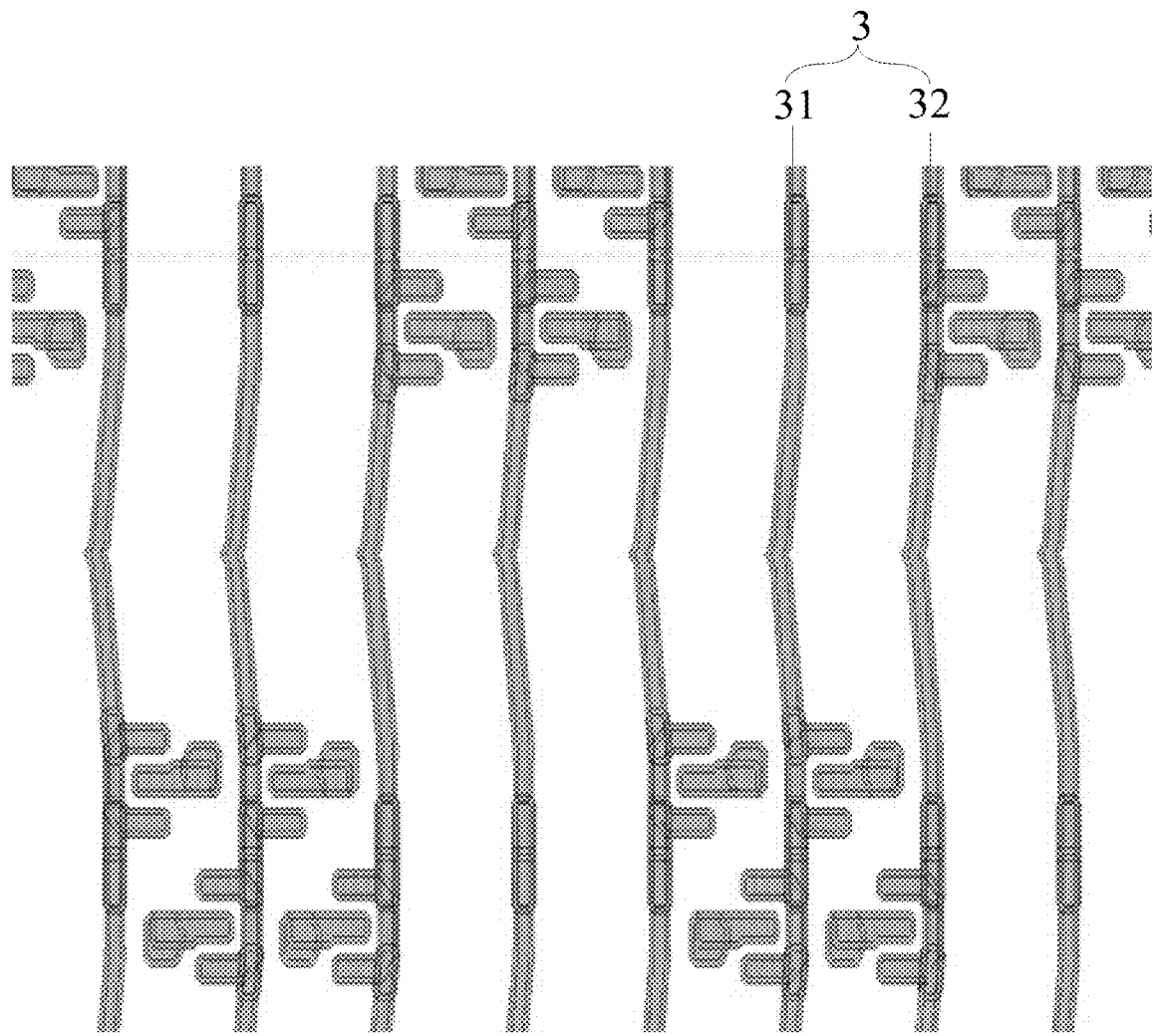
FIG. 7D is a schematic diagram of a single layer of a data line in FIG. 7A.
Figure 7E:
FIG. 7E is a schematic diagram of a single layer of a planarization layer in FIG. 7A.
Figure 7E:
Figure 7E:
Figure 7E:
Figure 7F:
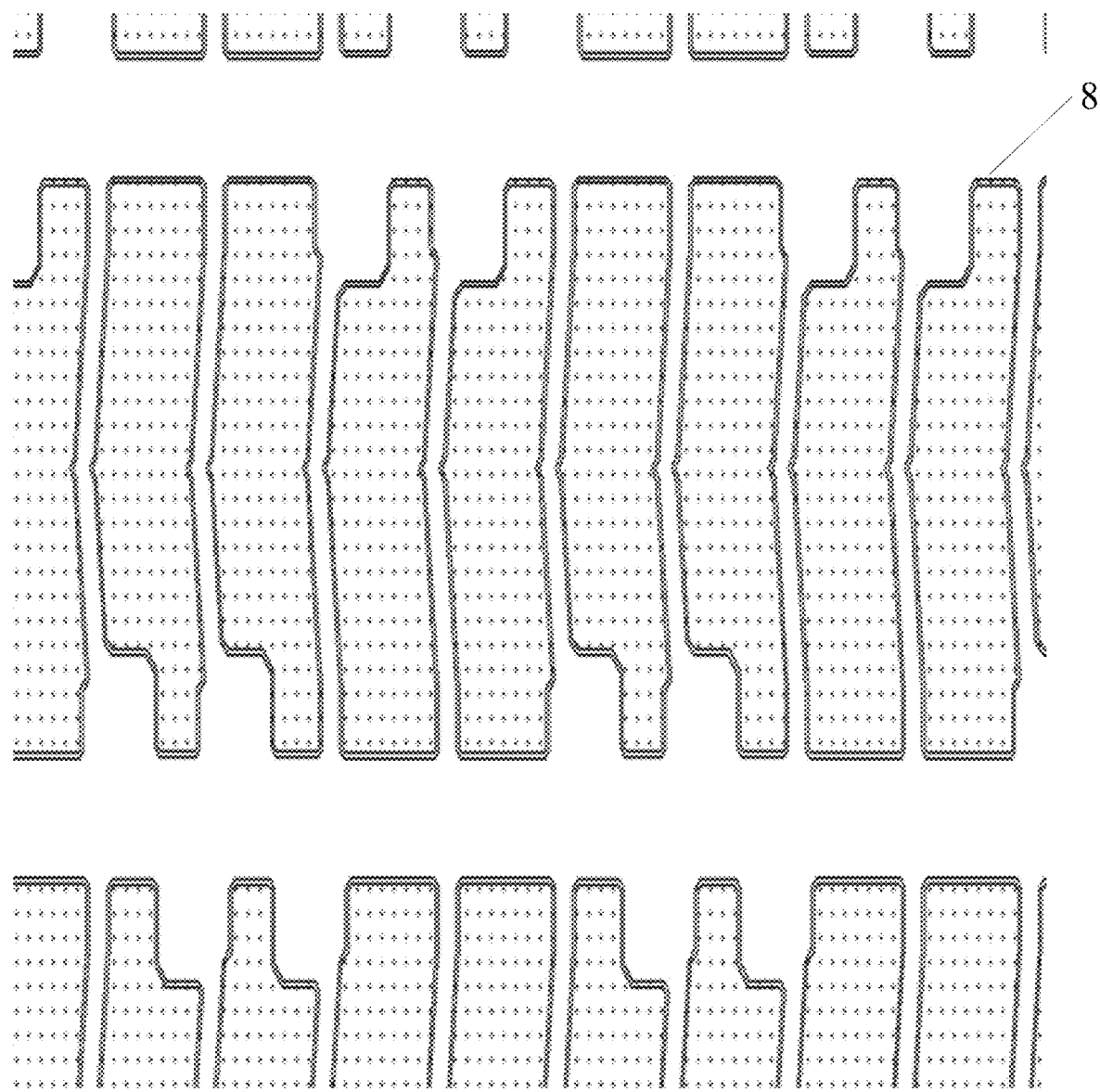
FIG. 7F is a schematic diagram of a single layer of a pixel electrode layer in FIG. 7A.
Figure 7G:
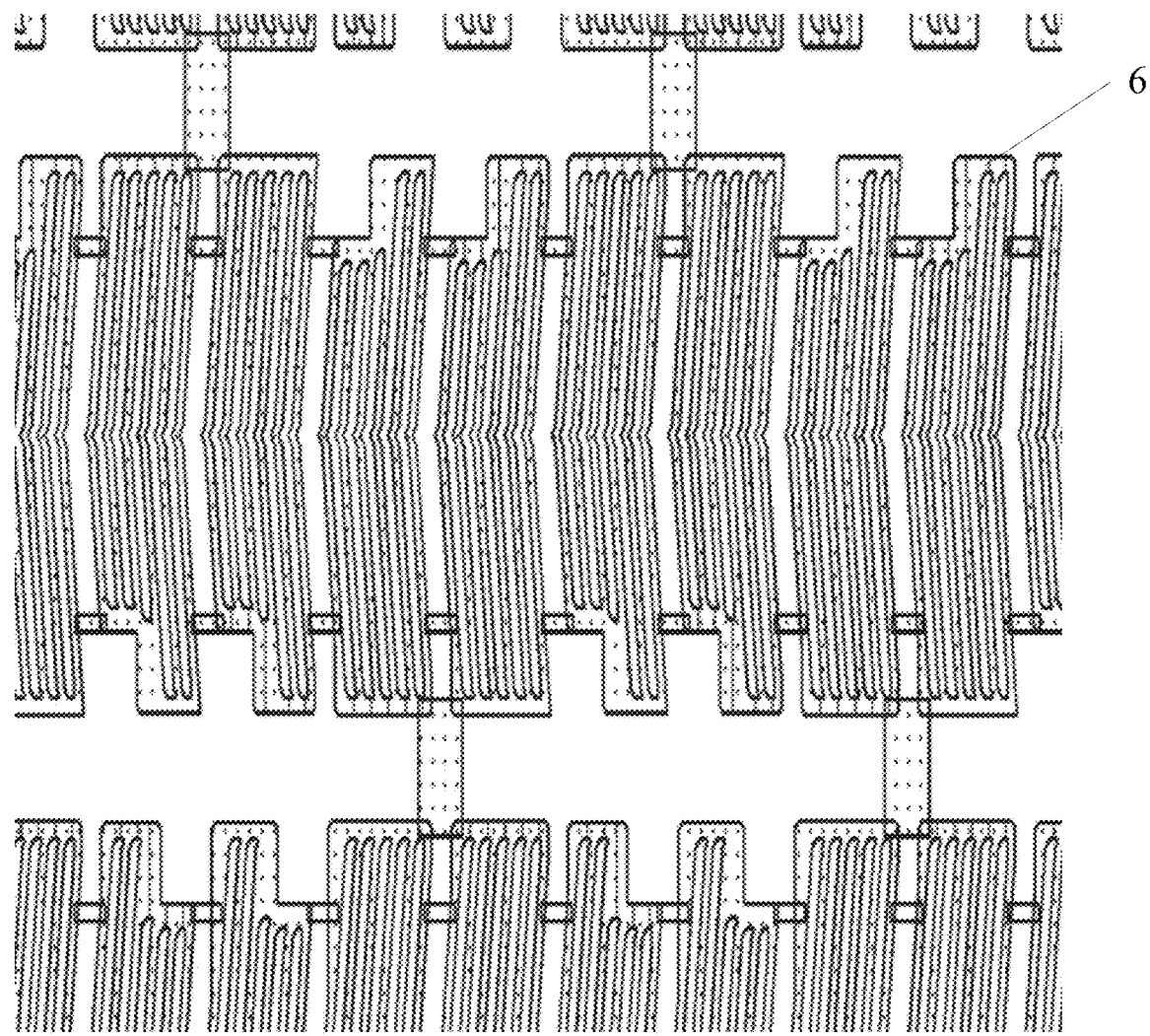
FIG. 7G is a schematic diagram of A single layer of A common electrode layer in FIG. 7A.

In view of this, see FIG. 4, FIG. 7A to FIG. 7G, where FIG. 7B is a schematic diagram of single layer of the gate line in FIG. 7A. FIG. 7C is a schematic diagram of a single layer of an active layer in FIG. 7A, FIG. 7D is a schematic diagram of a single layer of a data line in FIG. 7A, FIG. 7E is a schematic diagram of a single layer of a planarization layer in FIG. 7A, FIG. 7F is a schematic diagram of a single layer of a pixel electrode layer in FIG. 7A, and FIG. 7G is a schematic diagram of a single layer of a common electrode layer in FIG. 7A. Embodiments of the present disclosure provide a display substrate, including:

a base substrate 1;
a plurality of gate-line groups 20 on one side of the base substrate 1 and extending along the first direction X, at least one of the gate-line groups 20 includes two gate lines 2 extending along the first direction X;
a plurality of data lines 3 on the same side of the base substrate 1 with the gate lines 2 and extending along the second direction Y; the plurality of data lines 3 include first type of data lines 31 and second type of data lines 32 alternately arranged along the first direction X;
a plurality of transistors T in the area formed by the intersection of the gate-line groups 20 and the data lines 3, the plurality of transistors T include: sub-transistor groups T1 located between adjacent gate-line groups 20 and arranged along the first direction X; each sub-transistor group T1 includes two transistors T, the transistors T in the same sub-transistor group T1 are connected with the same gate line 2; the transistors T of the adjacent sub-transistor groups T1 are connected with different gate lines 2, and the transistors T of the same sub-transistor group T1 are connected with different data lines 3, that is, two adjacent transistors T connected with the same gate line 2 can be used as a sub-transistor group T1;
a plurality of pins 4 on the same side of the base substrate 1 as the gate line 2, and the plurality of pins 4 include: first type of pins 41 and second type of pins 42 arranged alternately along the first direction X; two adjacent first type of data lines 31 are connected with a same first type of pin 41, and adjacent second type of data lines 32 are connected with a same second type of pin 42. In some embodiments, the polarity of the signal loaded on the first type of pins 41 is opposite to the polarity of the signal loaded on the second type of pins 42, and when displaying adjacent frames, the polarity of the loaded signal is reversed in columns.

Figure 4:
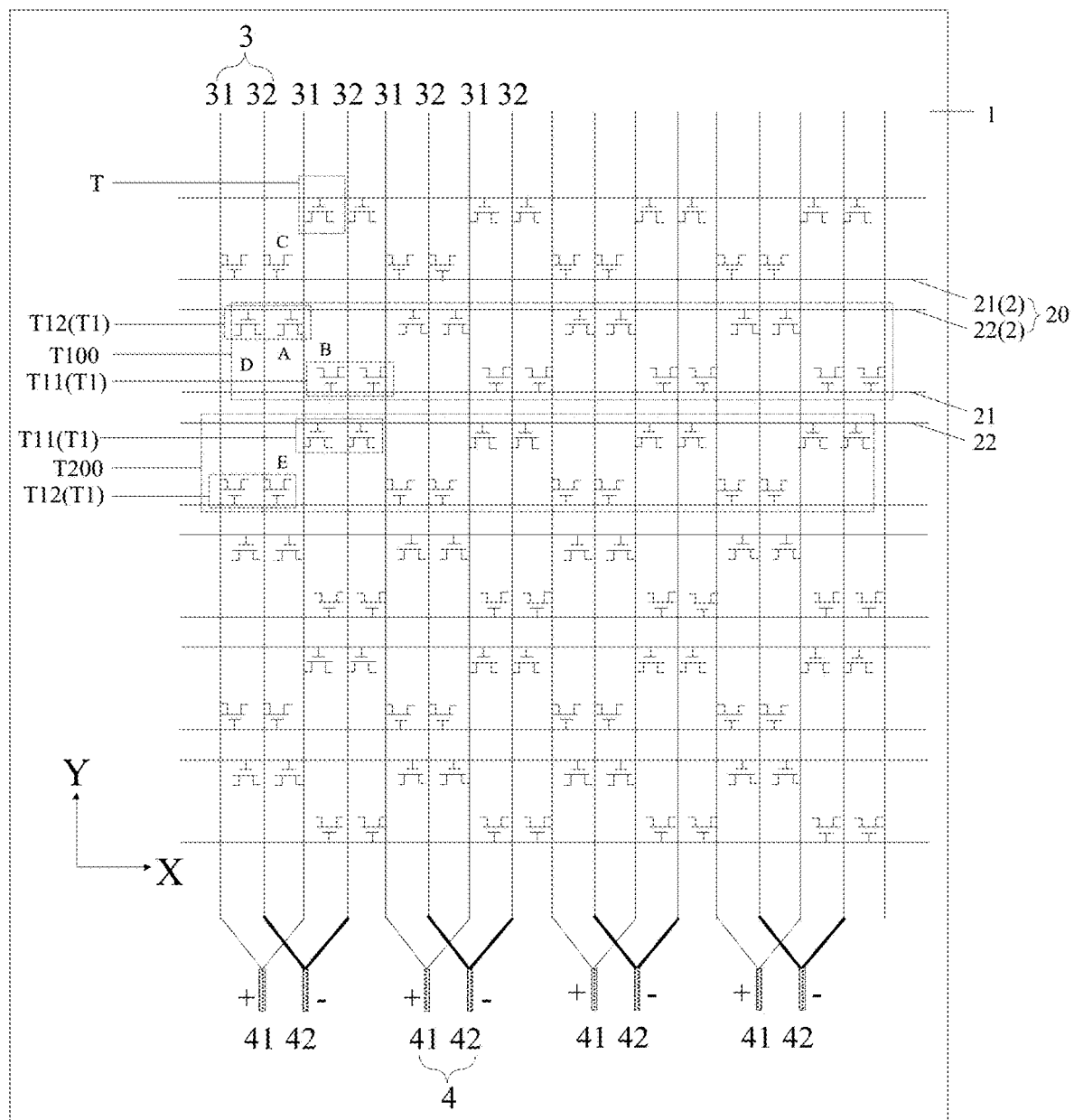
FIG. 4 is the first schematic diagram of the display panel provided by an embodiment of the present disclosure.

In some embodiments, for the display substrate provided in embodiments of the present disclosure, when performing a pure grayscale pattern display, as shown in FIG. 4, the signal loaded by the first type of pins 41 is of positive polarity, and the signal loaded by the second type of pins 42 is of negative polarity. In one frame, the signal loaded by the first type of pins 41 and the signals loaded by the second type of pin 42 are all DC, and the degree of charge of all pixel columns is the same, there is no difference in charging in different columns, and the polarity of adjacent sub-pixels is opposite. For example, in a certain frame, the signal loaded by the first type of pins 41 is positive polarity, the signal loaded by the second type of pins 42 is negative polarity, the pixel electrode of the sub-pixel A is charged with a positive voltage signal, the sub-pixel B, the sub-pixel C, the sub-pixel D, and the sub-pixel E around the sub-pixel A are all charged with a negative voltage signal of the second type of pins 42. The pull of the pixel voltage of the sub-pixel A to the voltage loaded by the common electrode (com) is a positive pull, and the pull of the voltage of the sub-pixels around the sub-pixel A to com is a negative pull. Because the pulling direction is opposite, the pull of the loading voltage of the common electrode cancels out, It is beneficial to improve flick and afterimage (if the pull of the loading voltage of the common electrode cannot be canceled, the loading voltage of the common electrode deviates from the center point after being pulled, the brightness difference of the positive and negative frames is larger, and the flick is aggravated; at the same time, when the loading voltage of the common electrode is pulled away from the center point, the DC bias in the display box is aggravated, resulting in an increase in the severity of the afterimage).

Figure 5:
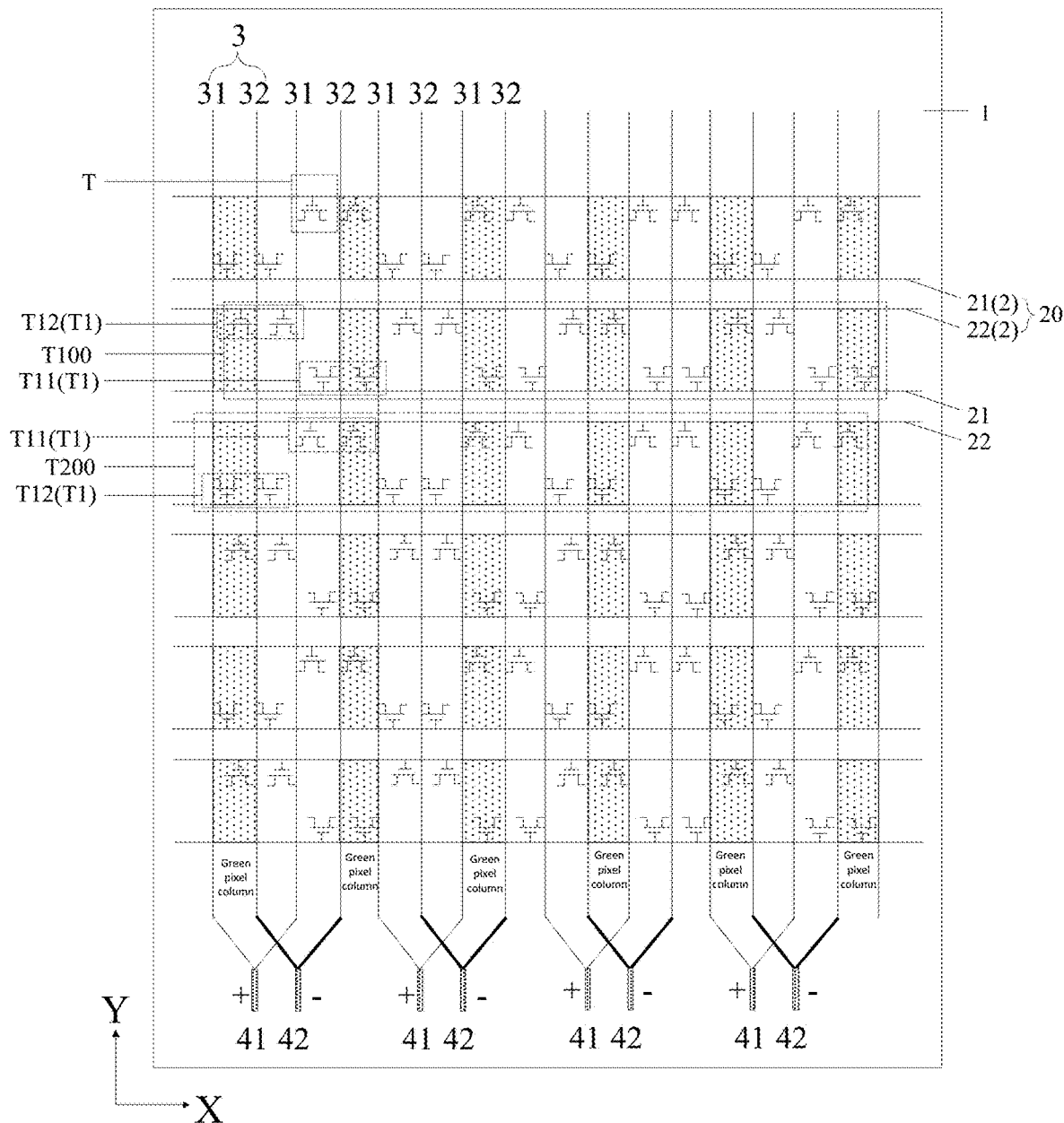
FIG. 5 is the second schematic diagram of the display panel provided by an embodiment of the present disclosure.

In some embodiments, for the display substrate provided in embodiments of the present disclosure, when displaying a pure color screen, such as a pure green screen display, as shown in FIG. 5, the signal loaded by the first type of pins 41 is of positive polarity, and the signal loaded by the second type of pins 42 is of negative polarity, both of which are column inversion. The voltage of the data lines 3 is a DC signal within one frame, and the charging rate of all positive green sub-pixels is the same, and the charging rate of all negative green sub-pixels is the same. Therefore, there is no charging difference in different columns of pure color pattern, and there are no poor vertical stripes. Moreover, the polarity of the adjacent green sub-pixels is opposite, and the pull of the pixel voltage on the voltage loaded by the common electrode (com) can be canceled, which is conducive to improving the flick and afterimage.

Figure 6:
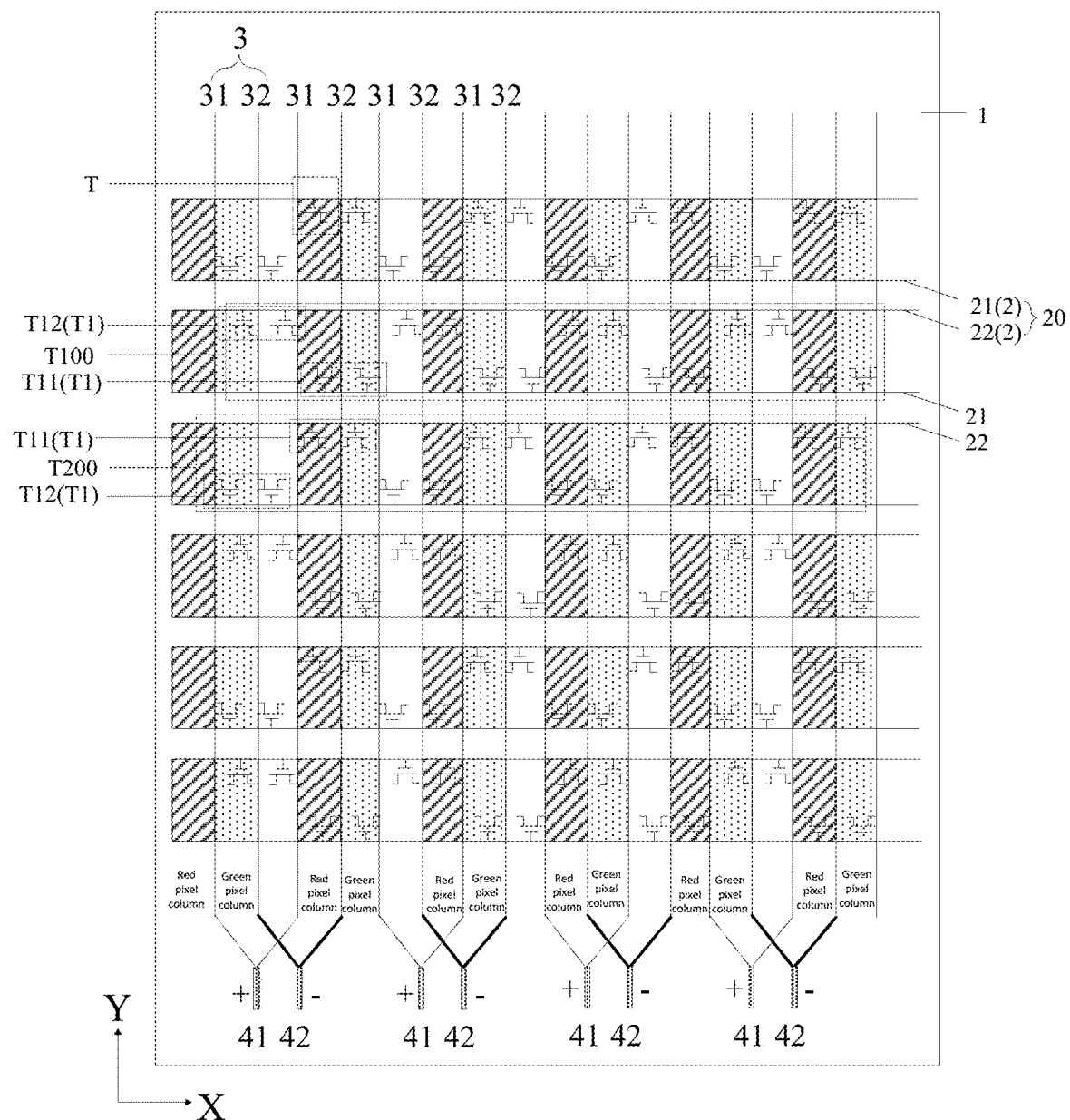
FIG. 6 is the third schematic diagram of the display panel provided by an embodiment of the present disclosure.

In some embodiments, for the display substrate provided in embodiments of the present disclosure, when displaying the mixed color pattern, for example, the yellow pattern of red and green mixed colors, as shown in FIG. 6, the sub-pixels corresponding to the red pixel column and the green pixel column are bright, and the blue pixel column is not bright. The display substrate and the pixel driving mode provided in the embodiment of the present disclosure are used, and the data voltages corresponding to the red and green sub-pixels in the color mixing pattern are AC signals, and there is no difference in the charging of different sub-pixels, so that the poor vertical strips existing in the existing dual gate pixels is solved from the root.

From the above, the display substrate and the driving mode provided in embodiments of the present disclosure have no charging differences when displaying pure grayscale patterns (i.e., yellow, green, and blue sub-pixels are all bright), pure color patterns, mixed color patterns, etc., and the poor vertical stripes are improved. At the same time, the column inversion greatly reduces the power consumption of the display substrate, that is, by increasing the number of gate lines, the number of data lines is reduced, which has the same purpose as the conventional dual gate products, which can reduce the number of ICs, has the effect of reducing costs, and at the same time, it can improve the limitation that the existing dual gate pixels cannot be inversed by columns, and greatly reduce the power consumption. Moreover, the column inversion can be achieved by using non-Z-shaped winding, and the opening rate is increased by 8%~10%. In addition, the pulls of the pixel voltage of adjacent sub-pixels performed on the loading voltage of the common electrode are opposite, and cancel each other out, which is conducive to improving the problems of flicker and afterimage.

In some embodiments, combined with FIG. 7A to FIG. 7G, the data lines 3 can be arranged on one side of the gate lines 2 facing away from the base substrate 1. A pixel electrode layer 8 can be arranged on a side of the data lines 3 facing away from the gate lines 2, and a common electrode layer 6 can be arranged on a side of the pixel electrode layer 8 facing away from the data lines 3. In some embodiments, the pixel electrodes of the pixel electrode layer 8 can be block-shaped, and the common electrode layer 6 can be a comb-like structure with slits.

In some embodiments, combined with FIG. 4 to FIG. 6, the gate-line groups 20 include: a first gate line 21 and a second gate line 22.

The plurality of transistors T include: a first transistor row T100 and a second transistor row T200 which extend along the first direction X and are alternately arranged along the second direction Y. The sub-transistor group T1 includes: the first sub-transistor group T11 and the second sub-transistor group T12 arranged alternately along the first direction X.

In the first transistor row T100, the transistor T in the first sub-transistor group T11 is connected with the first gate line 21, and the transistor T in the second sub-transistor T12 is connected with the second gate line 22. In the second transistor row T200, the transistor T in the first sub-transistor group T11 is connected with the second gate line 22, and the transistor T in the second sub-transistor T12 is connected with the first gate line 21, and two adjacent transistors T in the same column of transistors T are connected with different data lines 3.

Figure 7H:
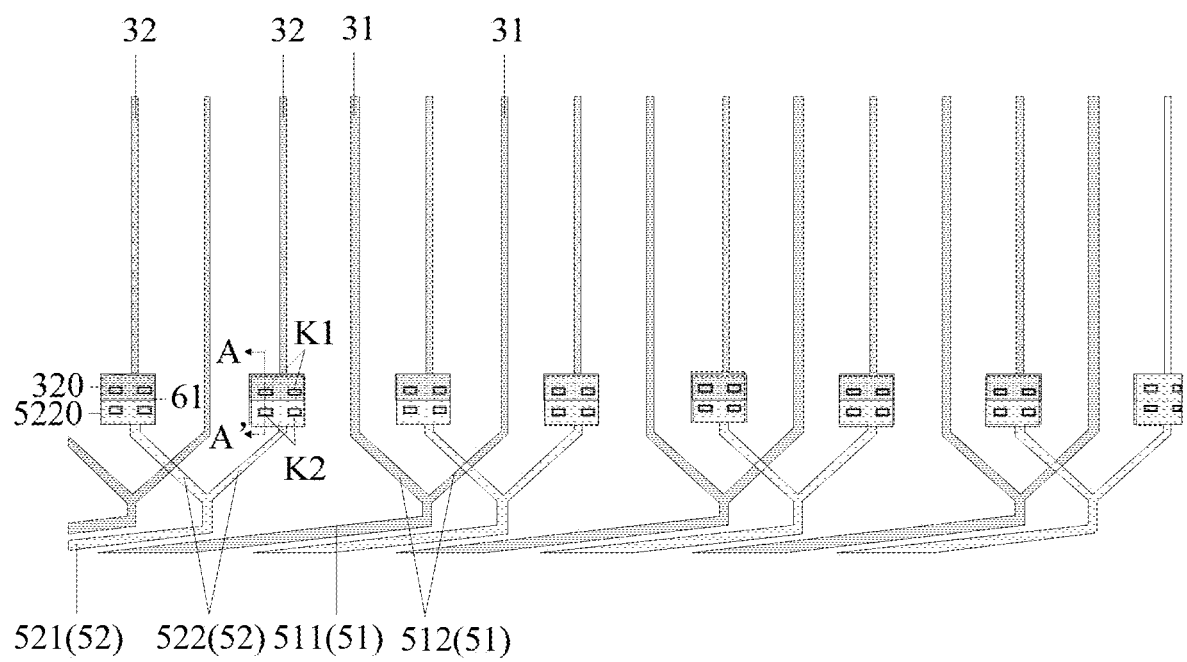
FIG. 7H is a schematic diagram of the distribution of the first lead and the second lead provided by an embodiment of the present disclosure.
Figure 7I:
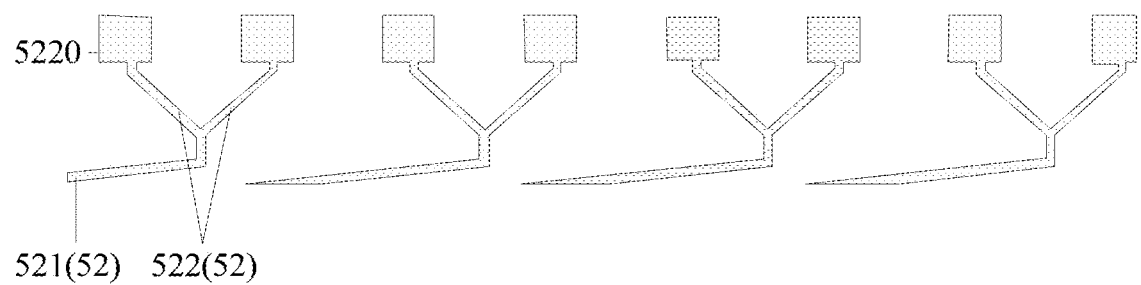
FIG. 7I is a schematic diagram of a single layer of a gate line layer in FIG. 7H.
Figure 7J:
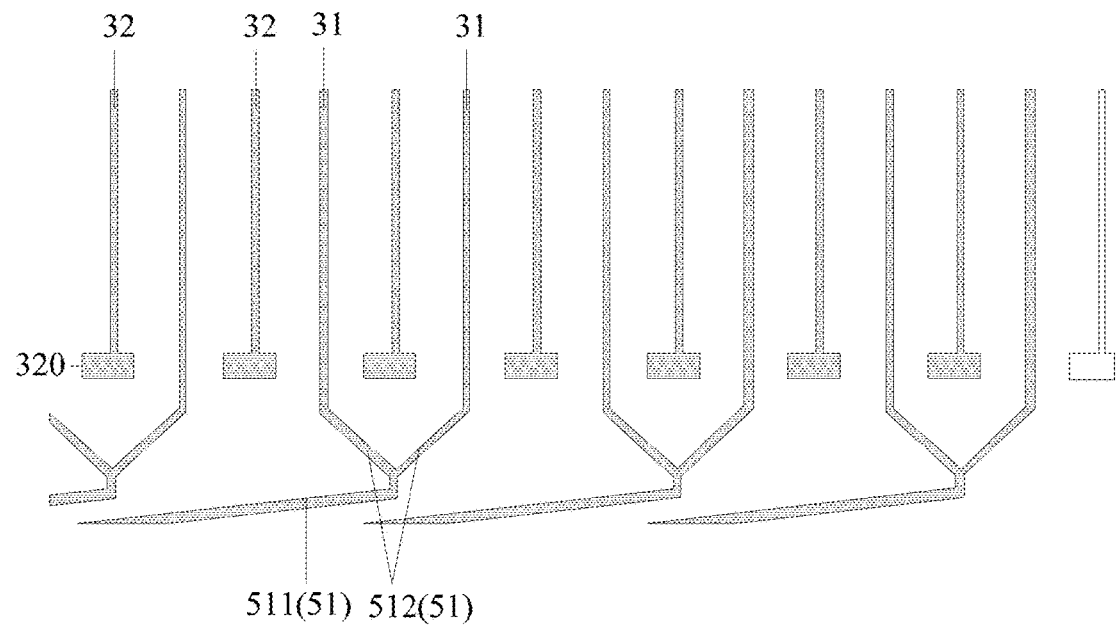
FIG. 7J is a schematic diagram of a single layer of a data line layer in FIG. 7H.
Figure 7K:
FIG. 7K is a schematic diagram of a single layer of a lap portion in FIG. 7H.
Figure 7L:
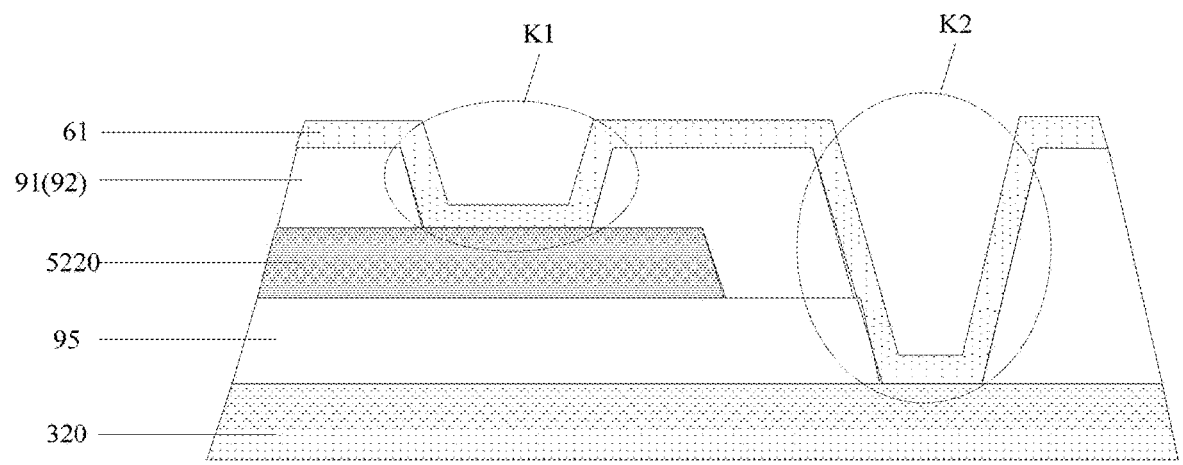
FIG. 7L is a schematic cross-section diagram along the dashed line AA' in FIG. 7H.

In some embodiments, see FIG. 7H to FIG. 7L, FIG. 7I is a schematic diagram of a single layer of a gate line layer in FIG. 7H, FIG. 7J is a schematic diagram of a single layer of data line layer in FIG. 7H, FIG. 7K is a schematic diagram of a single layer of a lap portion in FIG. 7H, FIG. 7L is a cross-sectional schematic diagram along the dashed line AA' in FIG. 7H. The base substrate further includes a plurality of first leads 51, and a plurality of second leads 52.

Each first lead 51 includes a first connecting portion 511, and two first lead ends 512. One end of the first connecting portion 511 is connected with the first type of pin 41, and the other end is connected with the two first lead ends 512. The other end of the first lead end 512 is connected with the first type of data line 31.

Each second lead 52 includes a second connecting portion 521, and two second lead ends 522. One end of the second connecting portion 521 is connected with a second type of pin 42, the other end is connected with the two second lead ends 522. The other end of the second lead end 522 is connected with a second type of data line 32. This allows different data lines to be electrically connected with different pins.

In some embodiments, as shown in FIG. 7H to FIG. 7L, the orthographic projection of one of the two first lead ends 512 on the base substrate 1 intersects with the orthographic projection of one of the two second lead ends 522 on the base substrate 1.

In some embodiments, as shown in FIG. 7H to FIG. 7L, the first lead 51 and the second leads 52 are arranged in different layers.

In some embodiments, as shown in FIG. 7H to FIG. 7L, the first leads 51 are arranged on a same layer as the data lines 3; the second leads 52 are arranged on a same layer as the gate lines 2.

In some embodiments, as shown in FIG. 7H to FIG. 7L, the display substrate further includes an adapter portion 61.

The end of the second type of data line 32 further includes a first lap portion 320. The orthographic projection of the adapter portion 61 on the base substrate 1 covers the orthographic projection of the first lap portion 320 on the base substrate 1, and the adapter portion 61 is connected with the first lap portion 320 through the second through hole K2.

The second lead end 522 further includes a second lap portion 5220. The orthographic projection of the adapter portion 61 on the base substrate 1 covers the orthographic projection of the second lap portion 5220 on the base substrate 1, and the adapter portion 61 is connected with the second lap portion 5220 through the first through hole K1.

The first lap portion 320 and the second lap portion 5220 are electrically connected through the adapter portion 61.

In some embodiments, the display substrate further includes a common electrode layer 6. The adapter portion 61 and the common electrode layer 6 are on the same layer and of the same material.

Figure 9A:
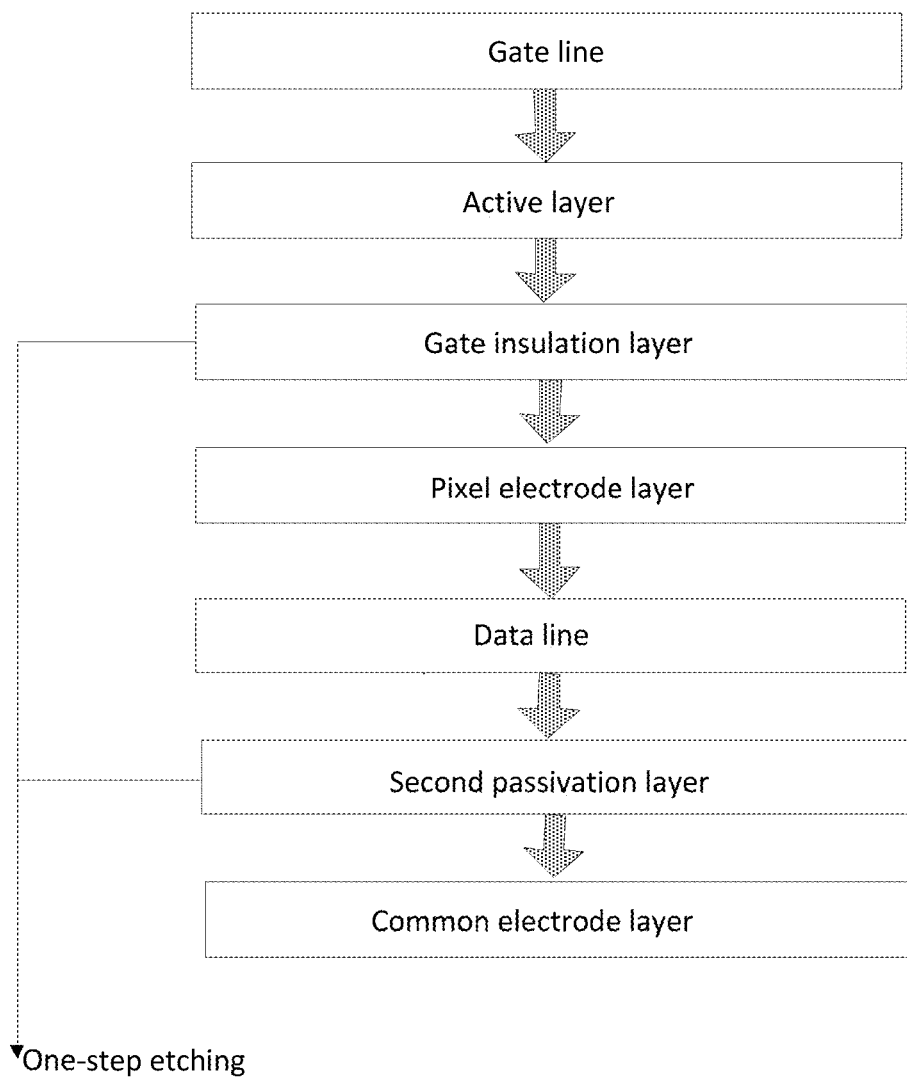
FIG. 9A is the first schematic diagram of the production process of the display panel provided by an embodiment of the present disclosure.

In some embodiments, for the display substrate provided in embodiments of the present disclosure, when specifically made, as shown in FIG. 9A, gate lines 2, an active layer 93, a gate insulation layer 95, a pixel electrode layer 8, data lines 3, a second passivation layer 92, and a common electrode layer 6 may be formed on one side of the base substrate in turn. The gate insulation layer 95 and the second passivation layer 92 can be composed by a one-step etching process.

Figure 8A:
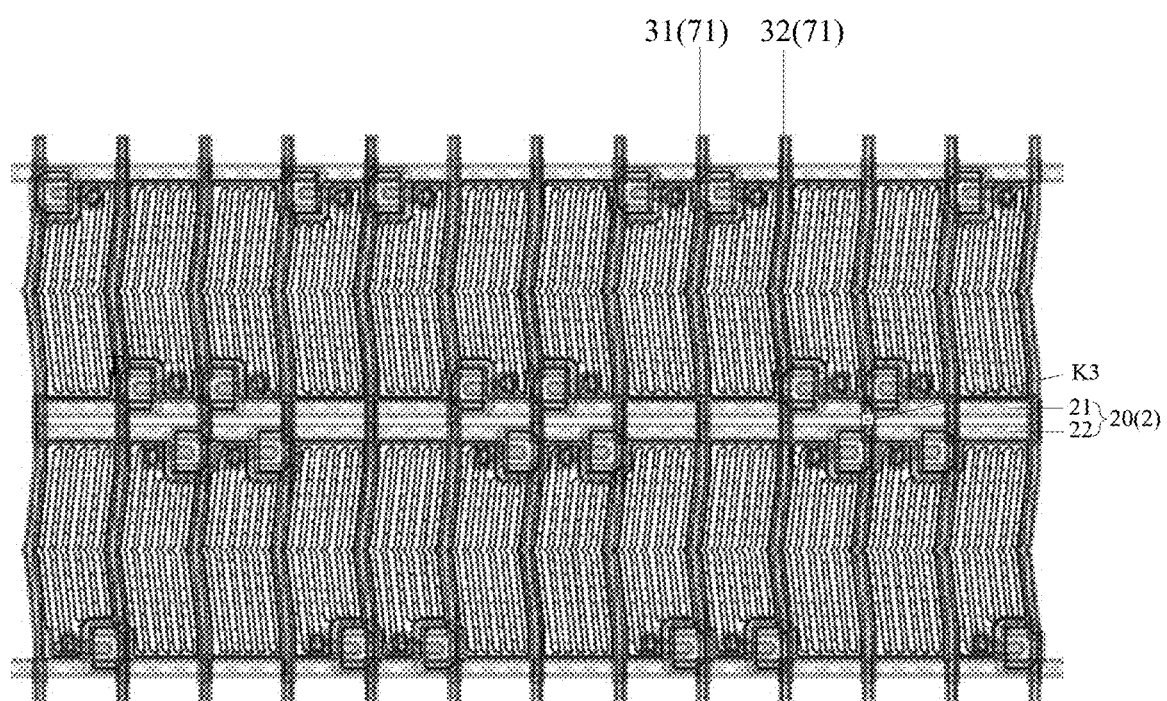
FIG. 8A is a schematic diagram of a display substrate with touch traces provided by an embodiment of the present disclosure.
Figure 8B:
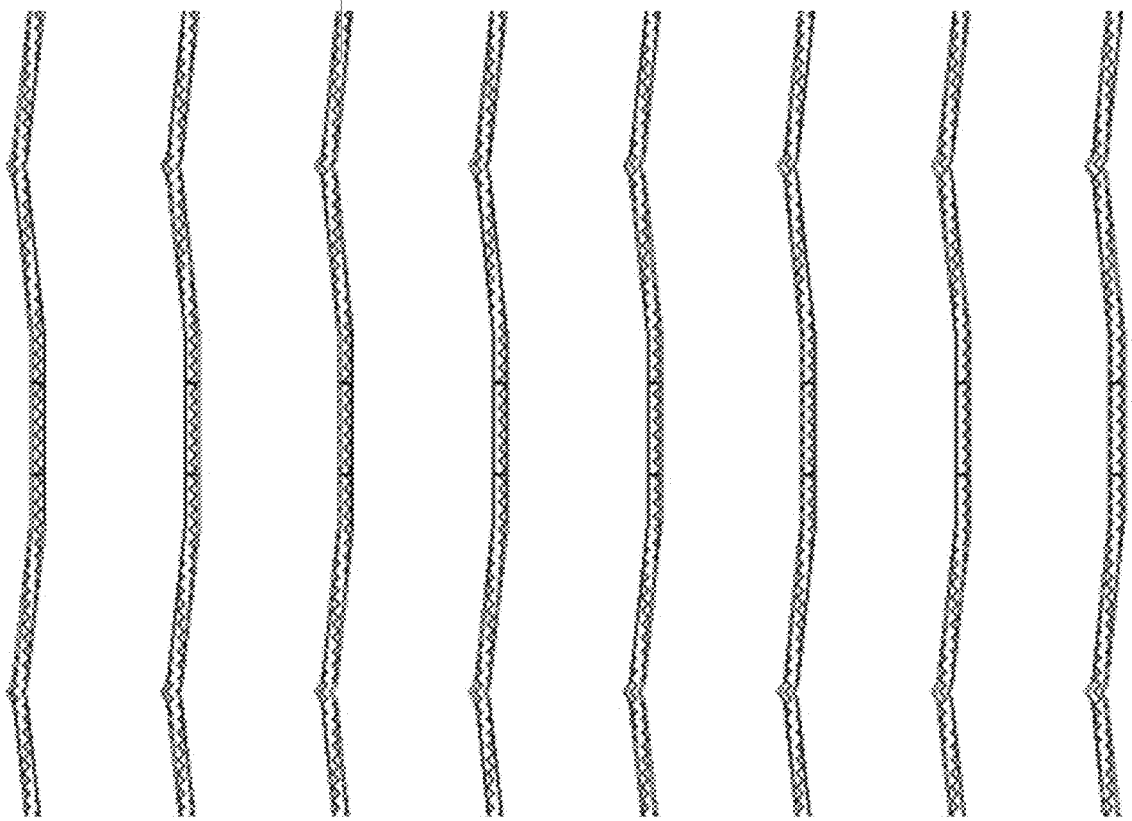
FIG. 8B is a schematic diagram of a single layer of a touch trace in FIG. 8A.

In some embodiments, as shown in FIG. 8A and FIG. 8B, FIG. 8B is a schematic diagram of a single layer of a touch trace 71 in FIG. 8A. The common electrode layer 6 is multiplexed as a touch electrode layer. The touch electrode layer includes a plurality of touch electrode blocks spaced from each other (not shown in the figure). The display substrate further includes a touch trace layer, and the touch trace layer includes touch traces 71 that correspond to the touch electrode blocks in one-to-one manner. The touch traces 71 and the data lines 3 are arranged on different layers.

In some embodiments, as shown in FIG. 8A and FIG. 8B, the orthographic projection of the touch trace 71 on the base substrate 11 covers and the orthotropic projection of the data line 3 on the base substrate 1. In some embodiments, the touch traces 71 can be set at the position where the data lines 3 are located. In some embodiments, the width of the touch trace 71 on the first direction X can be greater than the width of the data line 3 on the first direction X.

In some embodiments, the display substrate further includes a pixel electrode layer 8 on one side of the data line 3 facing away from the base substrate 1. The common electrode layer 6 is arranged on one side of the pixel electrode layer 8 facing away from the base substrate 1. The touch traces 71 are between the pixel electrode layer 8 and the common electrode layer 6.

Figure 9B:
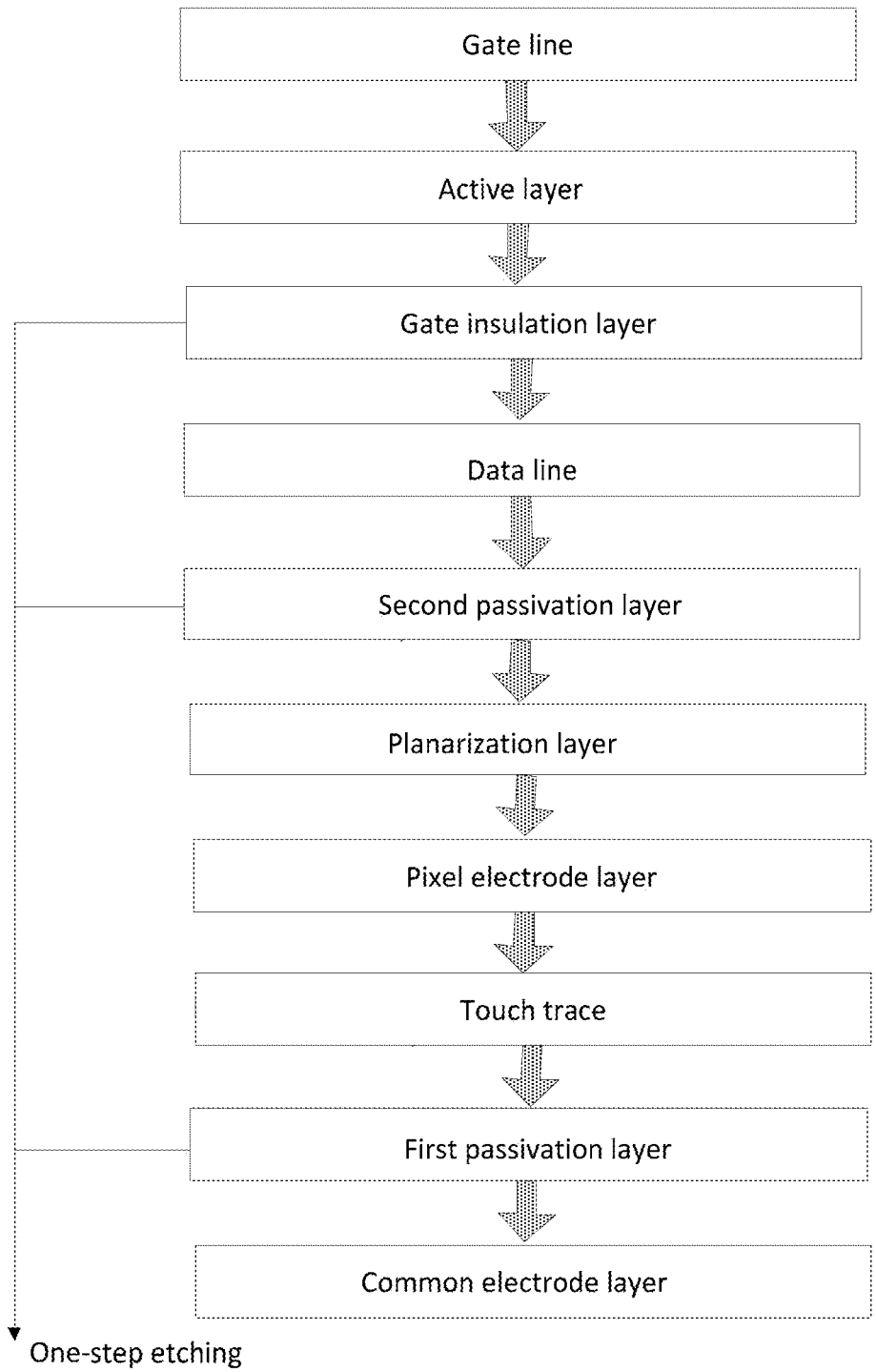
FIG. 9B is the second schematic diagram of the production process of the display panel provided by an embodiment of the present disclosure.

In some embodiments, when the display substrate provided in embodiments of the present disclosure is provided with the touch traces 71, in the specific production, as shown in FIG. 9B, gate lines 2, an active layer 93, a gate insulation layer 95, data lines 3, a second passivation layer 92, a planarization layer 94, a pixel electrode layer 8, touch traces 71, a first passivation layer 91, and a common electrode layer 6 can be formed on one side of the base substrate in turn. The gate insulating layer 95, the second passivation layer 92, and the first passivation layer 91 can be composed through a one-step etching process.

In some embodiments, as shown in FIG. 8A, FIG. 8B and FIG. 9B, a first passivation layer 91 is further arranged between the touch traces 71 and the common electrode layer 6. The first passivation layer 91 is provided with third through holes K3 exposing the touch traces 71. The touch traces 71 are electrically connected with the touch electrode blocks through the third through holes K3.

In some embodiments, as shown in FIG. 8A and FIG. 8B, the orthographic projection of each third through hole K3 on the base substrate 1, are located at the gap between two gate lines 2 of the same gate-line group 20.

Based on the same invention conception, embodiments of the disclosure further provides a display panel, including the display substrate as mentioned in embodiments of the present disclosure.

The display panel provided in embodiments of the disclosure is suitable for an Advanced Dimension Switch (ADS) type liquid crystal display, a High-Advanced Dimension Switch (HADS) type liquid crystal display of high opening rate, and also a Twisted Nematic (TN) type liquid crystal display. It is suitable not only for a-si transistor products, but also for oxide transistor display products and low-temperature polycrystalline silicon transistor display products.

Based on the same invention conception, embodiments of the present disclosure further provide a display device, which includes the display panel provided in embodiments of the present disclosure. The display device can be: mobile phones, tablet computers, televisions, monitors, laptops, digital photo frames, navigators, smart watches, fitness wristbands, personal digital assistants and any other products or components with display functions. The other indispensable components of the display device are those of ordinary skill in the art that should be understood, and are not repeated herein, nor should they be used as a limitation on the present invention. In addition, because the principle of the display device to solve the problem is similar to the principle of the display panel to solve the problem, the embodiment of the display device can refer to the embodiment of the liquid crystal display panel described above, and the repetition will not be repeated.

Figure 10:
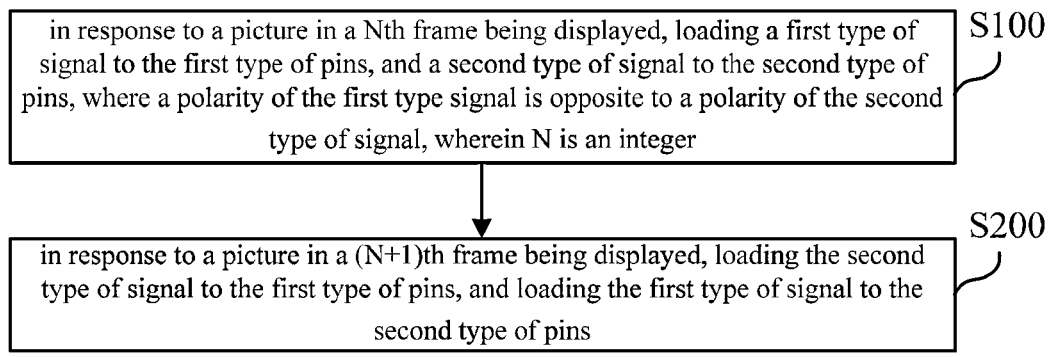
FIG. 10 is a schematic diagram of a driving method for the display panel provided by an embodiment of the present disclosure.

Based on the same invention conception, embodiments of the present disclosure further provide a driving method for the display substrate provided in embodiments of the present disclosure, as shown in FIG. 10, the driving method includes:

step S100, when displaying a picture at the Nth frame, loading a first type of signal to the first type pins, loading a second type of signal to the second type of pins; the polarity of the first type of signal is opposite to that of the second type of signal, N is an integer; For example, the first type of signal is a positive polarity signal, and the second type of signal is a negative polarity signal;

step S200, when displaying the picture in the (N+1)th frame, loading the second type of signal to the first type of pins, and loading the first type of signal to the second type of pins.

The display substrate and the driving mode provided in embodiments of the present disclosure have no charging difference when the pure grayscale pattern is displayed (i.e., yellow, green, and blue sub-pixels are all bright), the pure color pattern, the mixed color pattern, etc., and the poor vertical strips is improved. At the same time, the column inversion method greatly reduces the power consumption of the display substrate. That is, by increasing the number of gate lines, the number of data lines is reduced, which has the same purpose as the conventional dual gate products, which can reduce the number of ICs, has the effect of reducing costs, and at the same time, it can improve the limitation that the existing dual gate pixels cannot be inversed by columns, and greatly reduce the power consumption. Moreover, the column inversion can be achieved by using non-Z-shaped winding, and the opening rate is increased by 8%~10%. In addition, the pulls of pixel voltages of adjacent sub-pixels performed on the loading voltage of the common electrode are opposite and cancel each other out, which is conducive to improving the problems of flicker and afterimage.

Although preferred embodiments of the present disclosure have been described, those embodiments may be subject to additional changes and modifications once the basic inventive concepts are known to those skilled in the art. Therefore, the attached claims are intended to be construed to include the preferred embodiments and all changes and modifications that fall within the scope of the disclosure.

Obviously, a person skilled in the art may make various changes and variants to the embodiments of the present disclosure without departing from the spirit and scope of the embodiments of the present disclosure. Thus, if these modifications and variants of the embodiments of the present disclosure fall within the scope of the claims of the present disclosure and their equivalents, the present disclosure is also intended to include these modifications and variants.

What is claimed is:

1. A display substrate, comprising:
   a base substrate;
   a plurality of gate-line groups, on a side of the base substrate and extending along a first direction, wherein at least one of the plurality of gate-line groups comprises two gate lines extending along the first direction;
   a plurality of data lines, on the side of the base substrate with the gate lines and extending in a second direction; wherein the plurality of data lines comprise first type of data lines and second type of data lines alternately arranged along the first direction;
   a plurality of transistors, in an area formed by an intersection of the gate-line groups and the data lines, wherein the plurality of transistors comprise: sub-transistor groups arranged between adjacent gate-line groups and arranged along the first direction, each of the sub-transistor groups comprises two transistors, the transistors in a same sub-transistor group are connected with a same gate line, the transistors in adjacent sub-transistor groups are connected with different gate lines, and the transistors in a same sub-transistor group are connected with different data lines;
   a plurality of pins, on the side of the base substrate with the gate lines, wherein the plurality of pins comprise: first type of pins and second type of pins alternately arranged along the first direction; two adjacent first type of data lines are connected with a same first type of pin, and adjacent second type of data lines are connected with a same second type of pin.

2. The display substrate of claim 1, wherein each of the gate-line group comprises a first gate line and a second gate line;
   the plurality of transistors comprise: a first transistor row and a second transistor row extending along the first direction and alternately arranged along the second direction; each of the sub-transistor groups comprises a first sub-transistor group and a second sub-transistor group alternately arranged along the first direction;
   in the first transistor row, a transistor in the first sub-transistor group is connected with the first gate line, and a transistor in the second sub-transistor group is connected with the second gate line;
   in the second transistor row, a transistor in the first sub-transistor group is connected with the second gate line, and a transistor in the second sub-transistor group is connected with the first gate line; and two adjacent transistors in a same column are connected with different data lines.

3. The display substrate of claim 2, further comprises: a plurality of first leads and a plurality of second leads;
   wherein each of the first leads comprises: a first connecting portion and two first lead ends; one end of the first connecting portion is connected with the first type of pin, and the other end of the first connecting portion is connected with the two first lead ends; the other ends of the first lead ends are connected with the first type of data line;
   each of the second leads comprises: a second connecting portion and two second lead ends, one end of the second connecting portion is connected with the second type of pin, the other end of the second connecting portion is connected with the two second lead ends, and the other ends of the second lead ends are connected with the second type of data line.

4. The display substrate of claim 3, wherein an orthographic projection of one of the two first lead ends on the base substrate intersects with an orthographic projection of one of the two second lead ends on the base substrate.

5. The display substrate of claim 3, wherein the first leads and the second leads are arranged in different layers.

6. The display substrate of claim 5, wherein the first leads are arranged on a same layer as the data lines; the second leads are arranged on a same layer as the gate lines.

7. The display substrate of claim 3, further comprises an adapter portion;
   wherein an end of the second type of data line further comprises a first lap portion, an orthographic projection of the adapter portion on the base substrate covers an orthographic projection of the first lap portion on the base substrate, and the adapter portion is connected with the first lap portion through a second through hole;
   each of the second lead ends further comprises a second lap portion, the orthographic projection of the adapter portion on the base substrate covers an orthographic projection of the second lap portion on the base substrate, and the adapter portion is connected with the second lap portion through a first through hole;
   the first lap portion and the second lap portion are electrically connected with each other through the adapter portion.

8. The display substrate of claim 7, further comprises a common electrode layer, wherein the adapter portion and the common electrode layer are on a same layer and of a same material.

9. The display substrate of claim 1, wherein the common electrode layer is multiplexed as a touch electrode layer; the touch electrode layer comprises a plurality of touch electrode blocks spaced from each other;

the display substrate further comprises a touch trace layer, wherein the touch trace layer comprises touch traces that correspond to the touch electrode blocks in an one-to-one manner;

the touch traces and the data lines are arranged in different layers.

10. The display substrate of claim 9, wherein an orthographic projection of the touch trace on the base substrate covers an orthographic projection of the data line on the base substrate.

11. The display substrate of claim 9, further comprises: a pixel electrode layer arranged on a side of a layer where the data lines are located facing away from the base substrate;

wherein the common electrode layer is arranged on a side of the pixel electrode layer facing away from the base substrate;

the touch trace layer is between the pixel electrode layer and the common electrode layer.

12. The display substrate of claim 11, further comprises a first passivation layer between the touch trace layer and the common electrode layer, wherein the first passivation layer comprises third through holes exposing the touch traces, and the touch traces are electrically connected with the touch electrode blocks through the third through holes.

13. The display substrate of claim 12, wherein an orthographic projection of each of the third through holes on the base substrate is located at a gap between two gate lines in a same gate-line group.

14. A display panel, comprising the display substrate of claim 1.

15. A display device, comprising the display panel of claim 14.

16. A driving method for the display substrate of claim 1, wherein the driving method comprises:

in response to a picture in a Nth frame being displayed, loading a first type of signal to the first type of pins, and a second type of signal to the second type of pins, wherein a polarity of the first type signal is opposite to a polarity of the second type of signal, wherein N is an integer;

in response to a picture in a (N+1)th frame being displayed, loading the second type of signal to the first type of pins, and loading the first type of signal to the second type of pins.

17. The display panel of claim 14, wherein each of the gate-line group comprises a first gate line and a second gate line;

the plurality of transistors comprise: a first transistor row and a second transistor row extending along the first direction and alternately arranged along the second direction; each of the sub-transistor groups comprises a first sub-transistor group and a second sub-transistor group alternately arranged along the first direction;

in the first transistor row, a transistor in the first sub-transistor group is connected with the first gate line, and a transistor in the second sub-transistor group is connected with the second gate line;

in the second transistor row, a transistor in the first sub-transistor group is connected with the second gate line, and a transistor in the second sub-transistor group is connected with the first gate line; and two adjacent transistors in a same column are connected with different data lines.

18. The display panel of claim 17, wherein the display substrate further comprises: a plurality of first leads and a plurality of second leads;

wherein each of the first leads comprises: a first connecting portion and two first lead ends; one end of the first connecting portion is connected with the first type of pin, and the other end of the first connecting portion is connected with the two first lead ends; the other ends of the first lead ends are connected with the first type of data line;

each of the second leads comprises: a second connecting portion and two second lead ends, one end of the second connecting portion is connected with the second type of pin, the other end of the second connecting portion is connected with the two second lead ends, and the other ends of the second lead ends are connected with the second type of data line.

19. The display panel of claim 18, wherein an orthographic projection of one of the two first lead ends on the base substrate intersects with an orthographic projection of one of the two second lead ends on the base substrate.

20. The display panel of claim 18, wherein the first leads and the second leads are arranged in different layers.

* * * * *